(12) United States Patent
Onishi et al.

(10) Patent No.: US 8,530,877 B2
(45) Date of Patent: Sep. 10, 2013

(54) NON-VOLATILE SEMICONDUCTOR DEVICE

(75) Inventors: Junya Onishi, Osaka (JP); Shinobu Yamazaki, Osaka (JP); Kazuya Ishihara, Osaka (JP); Yushi Inoue, Osaka (JP); Yukio Tamai, Osaka (JP); Nobuyoshi Awaya, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 86 days.

(21) Appl. No.: 13/182,696

(22) Filed: Jul. 14, 2011

(65) Prior Publication Data
US 2012/0025163 A1   Feb. 2, 2012

(30) Foreign Application Priority Data

Jul. 29, 2010 (JP) ................................. 2010-171079

(51) Int. Cl.
*H01L 47/00*   (2006.01)
(52) U.S. Cl.
USPC ....................................... 257/4; 257/E29.011
(58) Field of Classification Search
USPC .............................................. 257/4, E29.011
See application file for complete search history.

(56) References Cited

U.S. PATENT DOCUMENTS

| | | | | |
|---|---|---|---|---|
| 4,738,947 | A * | 4/1988 | Wan et al. ....................... | 502/304 |
| 6,204,139 | B1 | 3/2001 | Liu et al. | |
| 6,912,163 | B2 * | 6/2005 | Zheng et al. ............. | 365/185.29 |
| 8,144,498 | B2 * | 3/2012 | Kumar et al. .................. | 365/148 |
| 2004/0180220 | A1 * | 9/2004 | Gueneau et al. .............. | 428/446 |
| 2008/0006907 | A1 | 1/2008 | Lee et al. | |
| 2010/0065803 | A1 * | 3/2010 | Choi et al. ......................... | 257/4 |
| 2010/0172170 | A1 | 7/2010 | Tamai et al. | |
| 2011/0096595 | A1 | 4/2011 | Terai | |
| 2011/0114912 | A1 | 5/2011 | Mikawa et al. | |

FOREIGN PATENT DOCUMENTS

| | | |
|---|---|---|
| CN | 101101964 | 1/2008 |
| JP | 2002-537627 | 11/2002 |
| JP | 2008-159760 | 7/2008 |

(Continued)

OTHER PUBLICATIONS

Liu, S. Q et al., "Electric-pulse-induced reversible resistance change effect in magnetoresistive films", Applied Physics Letter, vol. 76, pp. 2749-2751, 2000.

(Continued)

*Primary Examiner* — William D Coleman
(74) *Attorney, Agent, or Firm* — Nixon & Vanderhye P.C.

(57) ABSTRACT

A variable resistance element that can stably perform a switching operation with a property variation being reduced by suppressing a sharp current that accompanies completion of forming process, and a non-volatile semiconductor memory device including the variable resistance element are realized. The non-volatile semiconductor memory device uses the variable resistance element for storing information in which a resistance changing layer is interposed between a first electrode and a second electrode, and a buffer layer is inserted between the first electrode and the resistance changing layer where a switching interface is formed. The buffer layer and the resistance changing layer include n-type metal oxides, and materials of the buffer layer and the resistance changing layer are selected such that energy at a bottom of a conduction band of the n-type metal oxide configuring the buffer layer is lower than that of the n-type metal oxide configuring the resistance changing layer.

11 Claims, 24 Drawing Sheets

(56) References Cited

FOREIGN PATENT DOCUMENTS

| JP | 2008-306157 | 12/2008 |
|---|---|---|
| JP | 2009-135370 | 6/2009 |
| WO | WO 00/49659 | 8/2000 |
| WO | 2009/101785 A1 | 8/2009 |
| WO | WO 2009/154266 | 12/2009 |

OTHER PUBLICATIONS

H. Pagnia et al., "Bistable Switching in Electroformed Metal-Insulator-Metal Devices", Phys. Stat. Sol. (a), vol. 108, pp. 11-65, 1988.

Baek, I.G. et al., "Highly Scalable Non-volatile Resistive Memory using Simple Binary Oxide Driven by Asymmetric Unipolar Voltage Pulses", IEDM 04, pp. 587-590, 2004.

M. Terai et al., "Effect of Bottom Electrode of ReRAM with $Ta_2O_5$/$TiO_2$ Stack on RTN and Retention", IEDM 09, pp. 775-778, 2009.

J. Robertson, et al. "Band Offsets of High K Gate Oxides on III-V Semiconductors", J. AppL Phys. Lett. 100, 014111 (2006).

J. Robertson, "Band Offsets of Wide-Band-Gap Oxides and Implications for Future Electronic Devices", J. Vac. Sci. Technology B 18 (3), 1785•1791(2000).

\* cited by examiner

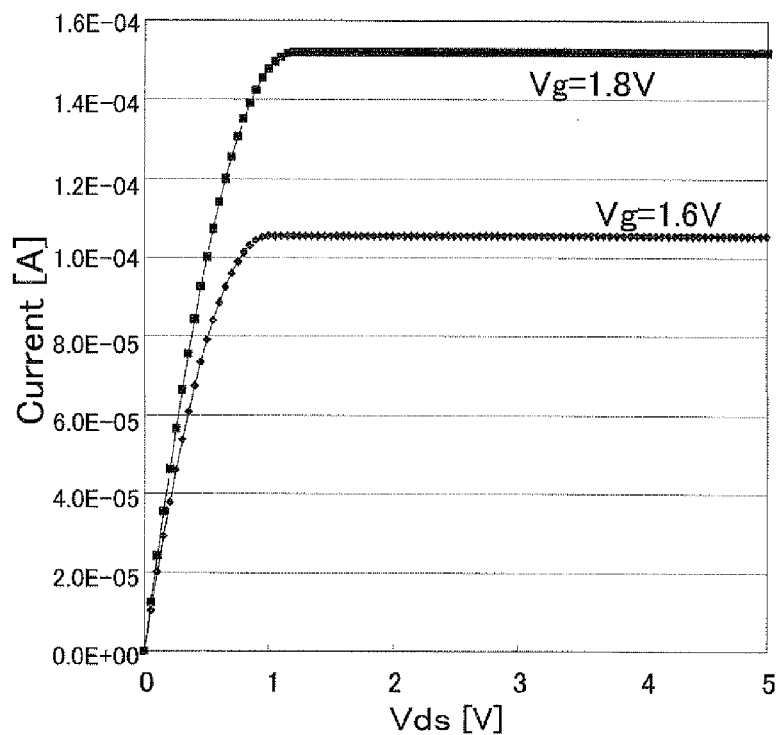
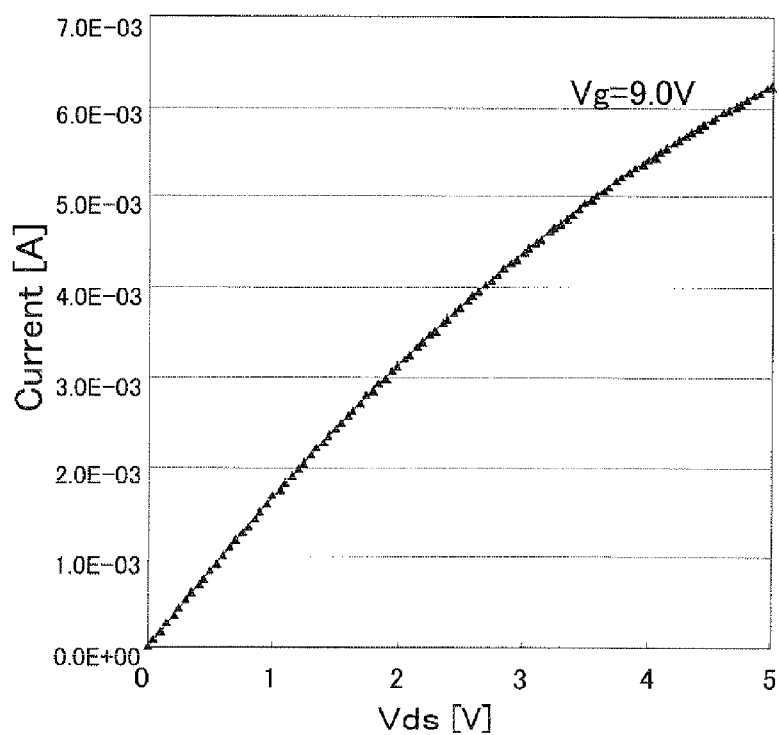

NON-VOLATILE SEMICONDUCTOR DEVICE

CROSS REFERENCE TO RELATED APPLICATION

This Nonprovisional application claims priority under 35 U.S.C. §119(a) on Patent Application No. 2010-171079 filed in Japan on Jul. 29, 2010 the entire contents of which are hereby incorporated by reference.

BACKGROUND OF THE INVENTION

1. Field of the Invention

The present invention relates to a non-volatile semiconductor memory device that uses a non-volatile variable resistance element configured by a first electrode, a second electrode, and a variable resistor interposed between the two electrodes for storing information.

2. Description of the Related Art

In the recent years, as a next-generation non-volatile random access memory (NVRAM: Non-volatile Random Access Memory) that takes place of a flash memory and is capable of a high-speed operation, various device structures such as FeRAM (Ferroelectric RAM), MRAM (Magnetic RAM), PRAM (Phase Change RAM), and the like have been proposed, and an intense competition in development is under progress from viewpoints of improving performance, increasing reliability, lowering costs, and process consistency.

With respect to these known techniques, there is proposed a resistance non-volatile memory RRAM (Resistive Random Access Memory) using a variable resistance element that reversibly changes its electric resistance by applying a voltage pulse. A configuration thereof is shown in FIG. 17.

As shown in FIG. 17, a variable resistance element of the conventional configuration has a structure in which a lower electrode 103, a variable resistor 102, and an upper electrode 101 are laminated in order, and has a property of being capable of reversibly changing a resistance value by applying a voltage pulse between the upper electrode 101 and the lower electrode 103. The configuration is such that a new non-volatile semiconductor memory device can be realized by reading the resistance value that changes due to this reversible resistance changing operation (hereinafter, referred to as "switching operation").

The above non-volatile semiconductor memory device has a memory cell array formed by arranging a plurality of memory cells, including variable resistance elements, in a matrix respectively in a row direction and a column direction, and is configured by arranging a peripheral circuit that controls programming, erasing, and reading operations of data with respect to each memory cell in the memory cell array. Further, as such a memory cell, there are a (so-called "1T1R type") memory cell configured by one selection transistor T and one variable resistance element R, a (so-called "1R type") memory cell configured by only one variable resistance element R, and the like based on a difference in their components. Among those, a configuration example of the 1T1R type memory cell is shown in FIG. 18.

FIG. 18 is an equivalent circuit diagram of a configuration example of a memory cell array formed of the 1T1R type memory cells. A gate of the selection transistor T of each memory cell is connected to a word line (WL1 to WLn), and a source of the selection transistor T of each memory cell is connected to a source line (SL1 to SLn) (n is a natural number). Further, one electrode of the variable resistance element R of each memory cell is connected to a drain of the selection transistor T, and the other electrode of the variable resistance element R is connected to a bit line (BL1 to BLm) (m is a natural number). Moreover, the respective word lines WL1 to WLn are connected to a word line decoder 106, the respective source lines SL1 to SLn are connected to a source line decoder 107, and the respective bit lines BL1 to BLm are connected to a bit line decoder 105. Further, the configuration is such that a particular bit line, word line, and source line for the programming, erasing, and reading operations on a particular memory cell in a memory cell array 104 are selected in accordance with an address input (not shown).

FIG. 19 is a schematic cross-sectional diagram of a memory cell configuring the memory cell array 104 of FIG. 18. In the present configuration, the selection transistor T and the variable resistance element R forms one memory cell. The selection transistor T is configured by a gate insulating film 113, a gate electrode 114, and a drain diffusion layer region 115 and a source diffusion layer region 116, and is formed on an upper surface of a semiconductor substrate 111 in which element isolating regions 112 are formed. Moreover, the variable resistance element R is configured by a lower electrode 118, a variable resistor 119, and an upper electrode 120.

Further, the gate electrode 114 of the transistor T configures the word line, and a source line wiring 124 is electrically connected to the source diffusion layer region 116 of the transistor T via a contact plug 122. Moreover, a bit line wiring 123 is electrically connected to the upper electrode 120 of the variable resistance element R via a contact plug 121, while the lower electrode 118 of the variable resistance element R is electrically connected to the drain diffusion layer region 115 of the transistor T via a contact plug 117.

With the configuration in which the selection transistor T and the variable resistance element R are arranged in series, the transistor of the memory cell that is selected by a potential change in the word line is caused to be in an ON state, and further, the programming or erasing can selectively be performed only on the variable resistance element R of the memory cell that is selected by a potential change in the bit line.

FIG. 20 is an equivalent circuit diagram of a configuration example of the 1R type memory cells. Each of the memory cells is configured only by the variable resistance element R, and one electrode of the variable resistance element R is connected to the word line (WL1 to WLn), and the other electrode thereof is connected to the bit line (BL1 to BLm). Further, the respective word lines WL1 to WLn are connected to the word line decoder 106, and the respective bit lines BL1 to BLm are connected to the bit line decoder 105. Further, the configuration is such that a particular bit line and word line for the programming, erasing, and reading operations on a particular memory cell in a memory cell array 131 are selected in accordance with the address input (not shown).

FIG. 21 is a perspective schematic structural diagram of an example of the memory cells configuring the memory cell array 131 of FIG. 20. As shown in FIG. 21, upper electrode wirings 132 and lower electrode wirings 133 are arranged so as to intersect each another, and one of the upper electrode wirings 132 and lower electrode wirings 133 form the bit lines, and the other of the upper electrode wirings 132 and lower electrode wirings 133 form the word lines. Moreover, it has a structure in which a variable resistor 134 is arranged at a point where respective electrodes intersect (typically referred to as a "cross point"). In the example of FIG. 21, for the sake of convenience, the upper electrode 132 and the variable resistor 134 are formed into the same shape, however, a portion of the variable resistor 134 that electrically contributes in the switching operation is the region of the cross point where the upper electrode 132 and the lower electrode 133 intersect each another.

Note that, as a variable resistor material used for the variable resistor 119 in FIG. 19 or the variable resistor 134 in FIG. 21, a method of reversibly changing the electric resistance by applying a voltage pulse on a Perovskite material that is known for its colossal magnet resistance effect is disclosed by Shangquing Liu, Alex Ignatiev et al. of University of Houston, U.S.A., in U.S. Pat. No. 6,204,139 as well as in Liu, S. Q et al., "Electric-pulse-induced reversible resistance change effect in magnetoresistive films", Applied Physics Letter, Vol. 76, pp. 2749-2751, 2000. Despite the usage of the Perovskite material that is known for its colossal magnet resistance effect, this method exhibits a resistance change of several orders even at a room temperature without any application of a magnetic field. In an element structure exemplified in U.S. Pat. No. 6,204,139, a film of praseodymium calcium manganese oxide $Pr_{1-x}Ca_xMnO_3$ (PCMO) that is a Perovskite-type oxide is used as the material of the variable resistor.

Moreover, as other variable resistor materials, oxides of transition metal elements such as a titanium oxide ($TiO_2$) film, a nickel oxide (NiO) film, a zinc oxide (ZnO) film, and a niobium oxide ($Nb_2O_5$) film are known to exhibit reversible resistance change from H. Pagnia at al., "Bistable Switching in Electroformed Metal-Insulator-Metal Devices", Phys. Stat. Sol. (a), vol. 108, pp. 11-65, 1988 and Back, I. G. et al., "Highly Scalable Non-volatile Resistive Memory using Simple Binary Oxide Driven by Asymmetric Unipolar Voltage Pulses", IEDM 04, pp. 587-590, 2004, and the like.

Further, the variable resistance elements in which the resistance change occurs exhibit n-type or p-type semiconductor conductivity by having an impurity level caused by oxygen defects in the metal oxide formed in a band gap. Further, the resistance change is confirmed as being a state change in the vicinity of an electrode interface.

In order to stably perform resistance switching of the variable resistance elements having the above transition metal oxides as the variable resistor, it is preferable to use only one of the two electrode interfaces of the variable resistance element as the switching region. Therefore, it is preferable to use different electrodes for the electrode materials on both ends, form a non-switching interface by making an ohmic contact at an interface with one electrode, and form a switching interface by making e.g. a Schottky barrier junction at an interface with the other electrode.

When the transition metal oxide is used as the variable resistor, an initial resistance of the variable resistance element just after a production is extremely high; and in order to bring it to a state in which switching between a high resistance state and a low resistance state is possible by an electric stress, there needs to be formed, prior to an actual use, a current path (hereinafter, suitably referred to as a "filament path") in which the resistance switching occurs by applying a voltage pulse having a larger voltage amplitude and a longer pulse width than a voltage pulse that is used in a normal writing operation to the variable resistance element in the initial state. Such a process of forming the filament path in the variable resistor is called forming process. The electrical property of the element thereafter is determined by the filament path formed by this forming process.

The forming process is one kind of a soft breakdown, and control of current from the beginning of the breakdown greatly affects the formation of the filament path, that is, the electrical property of the element.

As a principle, current for operations of the switching element should be able to be arbitrarily controlled if the filament path is formed by controlling the current upon the forming by a current controlling element such as a transistor connected in series to an element. However, due to the extremely sharp current increase upon the breakdown, for example, in a case where a transistor is used, as shown in an equivalent circuit diagram of FIG. 22A, a sharp current flow that cannot be controlled by the transistor occurs under an influence of a parasitic capacitance Cj of the transistor. Therefore, the change in the current flowing in the element after completion of the forming is as shown in FIG. 22B. Due to this uncontrollable sharp current, which is called spike current, the formed filament varies among the elements, and it becomes extremely difficult to stably form elements with operational current at a predetermined value or less.

In contrast, there has been reported a method that obtains a property improvement by forming a buffer layer between the electrode and the metal oxide used as the variable resistor.

Japanese Unexamined Patent Publication No. 2008-306157 discloses a method in which, with respect to nickel oxide and cobalt oxide that are the metal oxides to be p-type semiconductors, Ta, Ti, Al, and the like, which form a Schottky barrier junction therewith, are formed as an electrode on a switching interface side, and thereby, these electrode metals form titanium oxide and tantalum oxide by taking a part of oxygen from nickel oxide and cobalt oxide due to having a higher ionization tendency than nickel and cobalt, and the titanium oxide and tantalum oxide serve as a buffer layer and suppress the spike current caused by the parasitic capacitance, and thus a variable resistance element that operates with a low current is formed. However, since the ionization tendency of the electrode metals is higher than that of the metal oxide film of the variable resistor, there is a problem that the element property varies because oxidation of the electrode material has progressed further than it had been set by continuation of the switching operation and a thermal history on the element.

In M. Terai et al., "Effect of Bottom Electrode of ReRAM with $Ta_2O_5/TiO_2$ Stack on RTN and Retention", IEDM 09, pp. 775-778, 2009 (hereinafter, referred to as "well-known reference 1"), there is disclosed a method of realizing an improvement of property by using titanium oxide that is an n-type metal oxide as a variable resistance material and inserting tantalum oxide between the variable resistance material and a non-switching side electrode. However, in the case of aiming to obtain a stable switching property by using titanium oxide as the variable resistance material, Pt and Ru having a sufficiently large work function is required to be used as the switching side electrode, and it becomes difficult to manufacture a device using an already-existing facility.

SUMMARY OF THE INVENTION

In view of the above problem of the conventional technique, an object of the present invention is to realize a non-volatile semiconductor memory device including a variable resistance element in which a property variation among the variable resistance elements after forming process is suppressed, and a switching operation can be stably performed.

In order to achieve the above object, a non-volatile semiconductor memory device according to the present invention has a first feature that it uses a variable resistance element, which is formed by interposing a resistance changing layer between a first electrode and a second electrode, for storing information, wherein the variable resistance element is formed by inserting a buffer layer having a fixed resistance value between the resistance changing layer and the first electrode, the resistance changing layer includes an n-type first metal oxide, the buffer layer includes an n-type second metal oxide, energy at a bottom of a conduction band of the first metal oxide is higher than energy at a bottom of a conduction band of the second metal oxide, a band gap of the first metal oxide is larger than a band gap of the second metal oxide, the second electrode makes an ohmic contact with the resistance changing layer, and a work function of the first electrode is larger than a work function of the second electrode.

In order to achieve the above object, the non-volatile semiconductor memory device according to the present invention has a second feature that it uses a variable resistance element, which is formed by interposing a resistance changing layer between a first electrode and a second electrode, for storing information, wherein the variable resistance element is formed by inserting a buffer layer having a fixed resistance value between the resistance changing layer and the first electrode, the resistance changing layer includes an n-type first metal oxide, the buffer layer includes an n-type second metal oxide, energy at a bottom of a conduction band of the first metal oxide is higher than energy at a bottom of a conduction band of the second metal oxide, an absolute value of formation energy of the first metal oxide is larger than an absolute value of formation energy of the second metal oxide, the second electrode makes an ohmic contact with the resistance changing layer, and a work function of the first electrode is larger than a work function of the second electrode.

Further, in the non-volatile semiconductor memory device of the first or second feature above has a third feature that, by performing a forming process to the variable resistance element, a resistance state between the first and second electrodes changes from an initial high resistance state before the forming process to a variable resistance state, the resistance state in the variable resistance state transitions between two or more resistance states by applying an electric stress between the first electrode and the second electrode of the variable resistance element in the variable resistance state, and one resistance state after the transition is used for storing information, and the buffer layer operates as a resistance that suppresses a rapid increase of current that flows between both of the electrodes of the variable resistance element accompanying completion of the forming process.

In the present invention, by providing, between the resistance changing layer (variable resistor) and the first electrode, the buffer layer for suppressing the rapid increase of the current that flows between both of the electrodes of the variable resistance element accompanying the completion of the forming process, a sharp spike current that flows in the variable resistance element after the completion of the forming process is suppressed, and an element variation among filament paths that are to be formed can be reduced.

The buffer layer uses a material having smaller resistance than a material configuring the resistance changing layer. That is, in the case of using the n-type metal oxide as materials configuring both of the resistance changing layer and the buffer layer, those in which the energy at the bottom of the conduction band of the metal oxide configuring the resistance changing layer (first metal oxide) is higher than the energy at the bottom of the conduction band of the metal oxide configuring the buffer layer (second metal oxide) are used. With such a configuration, upon the forming process, most of the voltage is applied to the resistance changing layer. After the forming process has been complete and the resistance of the resistance changing layer has lowered, the buffer layer operates as the resistance to restrict the current flowing to the filament path. Accordingly, destruction of an element and a property variation caused by the sharp current flowing through the filament path can be suppressed.

Further, if the metal oxide of the buffer layer is structurally similar to the metal oxide of the resistance changing layer, the resistance switching occurs on both sides and the control of property becomes difficult. Therefore, the metal oxide of the buffer layer having smaller band gap than the metal oxide of the resistance changing layer is preferably used.

Meanwhile, in order for a switching interface to be formed in interfaces of a metal oxide and an electrode, a Fermi level of the electrode needs to be sufficiently low with respect to a Fermi level of the metal oxide. Here, since a Fermi level of the n-type metal oxide is determined by the energy at the bottom of the conduction band, the case of using the n-type metal oxide as the resistance changing layer does not need to use a noble metal such as Pt with a large work function, as compared to a case of using a p-type metal oxide, and materials with a small work function can be used as the electrode material. Especially, by employing a material such as $HfO_2$, $ZrO_2$, $Al_2O_3$ having a large band gap as the resistance changing layer, it becomes possible to configure the variable resistance element using a material such as TiN and TaN having an intermediate work function that can be used in an existing semiconductor facility as the electrode.

Further, since the n-type metal oxide bonds more strongly with oxygen than does Pt or TiN that typically is the switching electrode, it is stable with respect to heat. By using the n-type metal oxide for the resistance changing layer, a variable resistance element with high heat resistance can be realized.

FIG. 23 shows a relationship of a band gap and formation energy of a metal oxide. Here, a value obtained by dividing energy necessary for one oxygen molecule to react with metal to form an oxide of the metal by 2 is regarded as the formation energy of the metal oxide. Typically, an oxide of a metal is more stable than the metal, so the above formation energy becomes a negative value. Further, an absolute value of the formation energy is close to a binding energy of oxygen and the metal, and is an amount representing a proneness to an oxide being firmed therefrom. From FIG. 23, it can be seen that the n-type metal oxide typically has larger absolute value of the formation energy than the p-type metal oxide (i.e., has smaller formation energy), and is more stable with respect to heat.

Further, the buffer layer is inserted between the electrode and the resistance changing layer where the switching interface is formed. Conventionally, the buffer layer had been inserted between the resistance changing layer and an electrode on a non-switching side, such as Ta as shown in the well-known reference 1, but there had been no effect of improving the property. However, the inventors of the present application have come to believe as a result of their intensive study that the phenomenon of causing the variation and read disturb is occurring on a switching side; and so they tried to insert the metal oxide of the buffer layer in the interface with an electrode on the switching side in contrary to the teachings of the well-known reference 1, and have discovered that there is a significant effect of reducing the variation and suppressing the read disturb.

On the other hand, in the present invention, the second electrode that connects with the resistance changing layer without interposing the buffer layer makes an ohmic contact with the resistance changing layer. That is, the Fermi level of the second electrode is at a level that is about the same in terms of energy as an impurity level that is generated by an oxygen defect formed by the formation of the filament path in the metal oxide of the resistance changing layer. In contrast, since the connection of the first electrode and the resistance changing layer is a rectifying contact interposing the buffer layer, the Fermi level of the first electrode needs to be at a level lower than the impurity level. Due to this, the materials of the first electrode and the second electrode are selected from among materials in which the connection of the second electrode and the resistance changing layer is made to be in the ohmic contact and the Fermi level of the first electrode is made to be at a level lower than the Fermi level of the second electrode. In other words, the materials of the first electrode and the second electrode are selected such that the work function of the first electrode is larger than the work function of the second electrode, and the connection of the second electrode and the resistance changing layer is made to be in the ohmic contact.

Hereinafter, examples of materials that can configure the non-volatile semiconductor memory device of the present invention are listed. Firstly, it is preferable that the resistance changing layer includes an oxide of one element of Hf and Zr. As described above, since these materials have a large band gap, it becomes possible to configure the variable resistance element using the material having the intermediate work function that can be used in the existing semiconductor facility as the first electrode. Further, it becomes easier to select the metal oxide that is to be the buffer layer. Note that energy levels from vacuum levels at the bottoms of the conduction bands of the oxides are respectively −2.8 eV ($HfO_2$) and −3.0 eV ($ZrO_2$).

Further, it is preferable that the material of the buffer layer includes an oxide of one element of Ti, Ta, Zn, Nb and W. Note that energy levels from the vacuum levels at the bottoms of the conduction bands of the oxides are respectively −3.8 eV ($TiO_2$), −3.7 eV ($Ta_2O_5$), −4 eV (ZnO), −4 eV ($Nb_2O_5$), and −4.2 eV ($WO_3$).

Further, it is preferable that the material of the first electrode includes one of TiN (4.7 eV), TaNx (4.05 to 5.4 eV depending on stoichiometric composition of nitride), W (4.5 eV), Ni (5.2 eV), and Co (4.45 eV). Note that a value of the work function for each metal is indicated in parenthesis.

Further, it is preferable that the material of the second electrode includes one of Ti (4.14 eV), Ta (4.2 eV), Al (4.1 eV), Hf (3.9 eV), and Zr (4.05 eV). Note that a value of the work function for each metal is indicated in parenthesis.

Further, it is preferable that the buffer layer includes an oxide of one of Ti and Ta, and the first electrode includes one of Ti nitride and Ta nitride. The non-volatile semiconductor memory device of the present invention can be configured by an easy manufacturing process.

Further, the non-volatile semiconductor memory device of the present invention preferably further has a structure in which the variable resistance element includes: an opening portion penetrating an interlayer insulating film on the first electrode; a resistance changing layer covering an inner wall surface and a bottom surface of the opening portion; and the second electrode covering the resistance changing layer inside the opening portion, wherein the resistance changing layer makes contact at a bottom part of the opening portion with the buffer layer that is an oxide of a metal that configures the first electrode, and the resistance changing layer connects with the first electrode via the buffer layer.

Further, the non-volatile semiconductor memory device according to the present invention preferably further has a structure in which the variable resistance element includes: an opening portion that penetrates an interlayer insulating film on a lower wiring; a first electrode filling the opening portion; the resistance changing layer covering an upper surface of the opening portion; and the second electrode formed on the resistance changing layer, wherein the buffer layer that is an oxide of a metal that configures the first electrode is formed at an upper part of the opening portion, and the resistance changing layer connects with the first electrode via the buffer layer at the upper surface of the opening portion.

Thus, according to the present invention, the property variation among the variable resistance elements after the forming process is suppressed, and the variation in the resistance value among the variable resistance elements between after having applied the program voltage pulse and after having applied the erase voltage pulse can be reduced. Accordingly, a stable switching operation can be performed, and it is advantageous in a case of increasing a capacity for binary segmentation.

Moreover, a highly reliable semiconductor memory device having high durability to read disturbs which can be written a large number of times can be provided.

BRIEF DESCRIPTION OF THE DRAWINGS

FIGS. 24A and 24B are diagrams showing a voltage-current property of an NMOS transistor connected with the variable resistance element used for verification of the effect of the present invention.

DESCRIPTION OF THE PREFERRED EMBODIMENTS

First Embodiment

Figure 1:
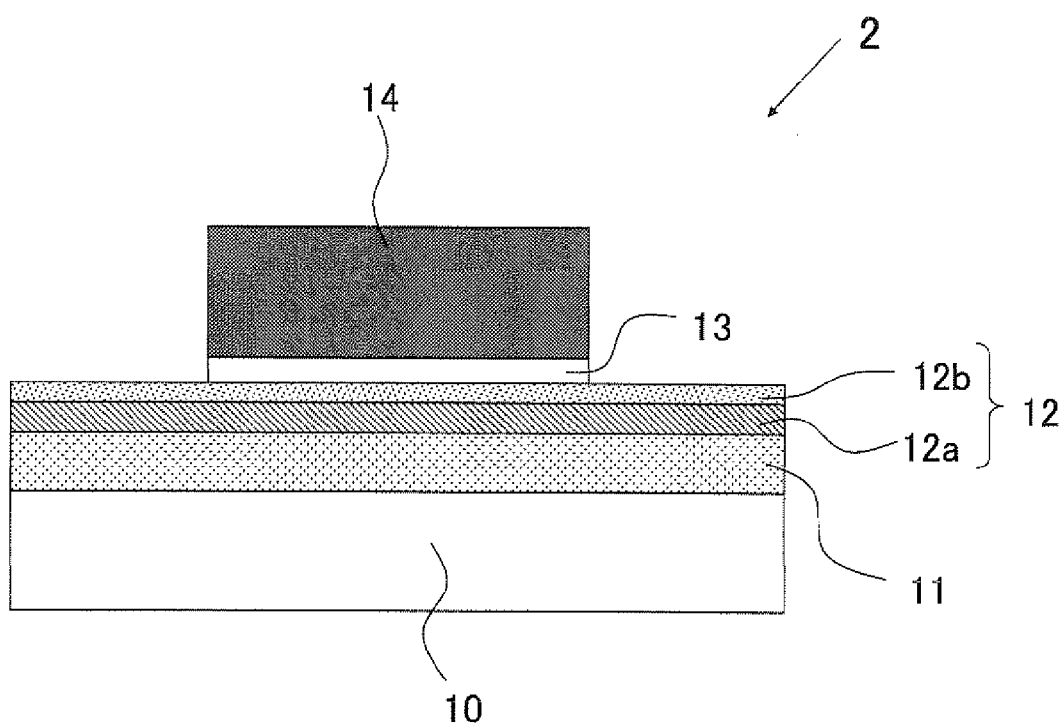
FIG. 1 is a schematic cross-sectional diagram showing a structure of an example of a variable resistance element of the present invention.

FIG. 1 is a cross-sectional diagram schematically showing an element structure of a variable resistance element 2 used in a non-volatile semiconductor memory device (hereinafter, suitably referred to as "present invention device 1") according to an embodiment of the present invention. Note that in the subsequent drawings, main portions are indicated with emphasis in relation to the sake of description, and dimensional ratio of respective portions of the element may not necessarily be identical to an actual dimensional ratio.

In the present embodiment, hafnium oxide ($HfO_2$) that is an insulating layer with a large band gap is selectively used as a resistance changing layer, and titanium oxide ($TiO_2$) that is an insulating layer with a small band gap is selectively used as a buffer layer. Further, in order to form a Schottky barrier junction at one of interfaces of the insulating layer and an electrode, a titanium nitride (TiN) electrode is brought into contact with a titanium oxide layer, and tantalum (Ta) is used for a counterpart electrode making an ohmic contact. However, the present invention is not limited to this configuration. Zirconium oxide ($ZrO_2$) or the like may be used as the resistance changing layer, and tantalum nitride (TaN), tantalum oxide ($Ta_2O_5$), zinc oxide (ZnO), niobium oxide ($Nb_2O_5$), tungsten oxide ($WO_3$), or the like may be used as the buffer layer. Note that a film thickness of the buffer layer is set to be a thin film thickness to an extent in which a resistance thereof does not change under an operational condition that changes a resistance of the resistance changing layer.

A method of manufacturing the variable resistance element 2 is described below. First, on a monocrystal silicon substrate 10, a silicon oxide film having a thickness of 200 nm is formed as an insulating layer 11 by a thermal oxidation method. Thereafter, a titanium nitride film having a thickness of 100 nm is formed as a first electrode material 12 on the silicon oxide film 11 by a sputtering method. Then, a part of the titanium nitride film 12 is oxidized by a radical oxidation, and a titanium oxide film 12b having a thickness of about 2 nm that is to be a buffer layer is formed. At this time, the titanium nitride film 12 at a lower portion that was not oxidized becomes a first electrode 12a and is isolated from the titanium oxide film 12b.

Thereafter, on the titanium oxide film 12b, e.g., a hafnium oxide film having a thickness of about 3 nm is formed by an ALD (Atomic Layer Deposition) method so as to be formed uniformly as a resistance changing layer 13. Thereafter, on the resistance changing layer 13, a tantalum thin film having a thickness of 150 nm is formed by the sputtering method as a second electrode material 14. Finally, a pattern is formed by a photo resist process, and an element region of 1 μm×1 μm is formed by dry etching as shown in FIG. 1. In this manner, the variable resistance element 2 is produced.

Hereinafter, as comparative examples for showing an effect of laminating the buffer layer 12b, one in which the radical oxidation is not performed on the first electrode material 12 and the hafnium oxide film 13 with the thickness of about 3 nm is deposited by the ALD method (comparative example 1) and one in which the radical oxidation is not performed on the first electrode material 12 and the hafnium oxide film 13 with the thickness of about 5 um is deposited by the ALD method (comparative example 2) are produced together, and a result of an experiment on a variation in switching property among the elements are shown below. That is, the comparative example 1 has a configuration in which the titanium oxide film as the buffer layer 12b is omitted from the variable resistance element 2 of the present invention, and the comparative example 2 has a configuration in which the buffer layer 12b of the variable resistance element 2 of the present invention is replaced with the hafnium oxide film 13 that is to be the resistance changing layer. Note that, in a case of not depositing hafnium oxide and a single layer of the titanium oxide film having a thickness of 2 nm formed by the radical oxidation is provided, no resistance change was observed. Consequently, it can be seen that the hafnium oxide film functions as the resistance changing layer.

Figure 2:
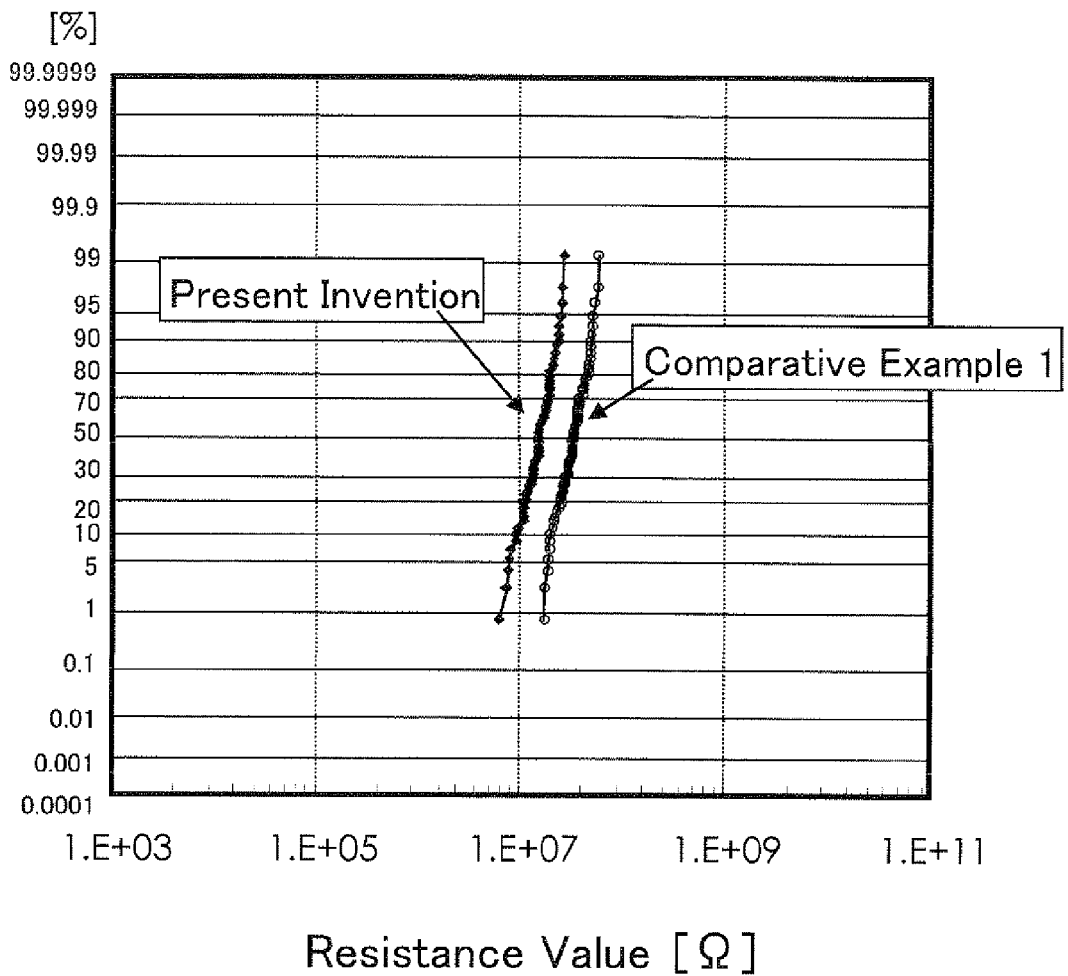
FIG. 2 is a cumulative frequency distribution diagram showing initial resistance values of the variable resistance element of the present invention and an element of a comparative example 1.

As for each of the variable resistance element 2 of the present invention and the comparative example 1, resistance values are calculated from amounts of current that flows upon a voltage application of 1.7 V between electrodes, for each of 50 elements (50 bits), and a result of a conversion into a cumulative frequency distribution of the resistance values is shown in FIG. 2. The same experiment was performed for the comparative example 2, however, the amount of current in the comparative example 2 became a value equal to or smaller than the minimal measurable value of a measuring device, and thus measurement was not possible. From FIG. 2, it can be said that the hafnium oxide film 13 as the resistance changing layer in the case of the resistance changing layer being a single layer (comparative example 1) is formed uniformly at about the same degree as that in the case of a laminate of the resistance changing layer and the buffer layer 12b (the present invention).

Figure 3:
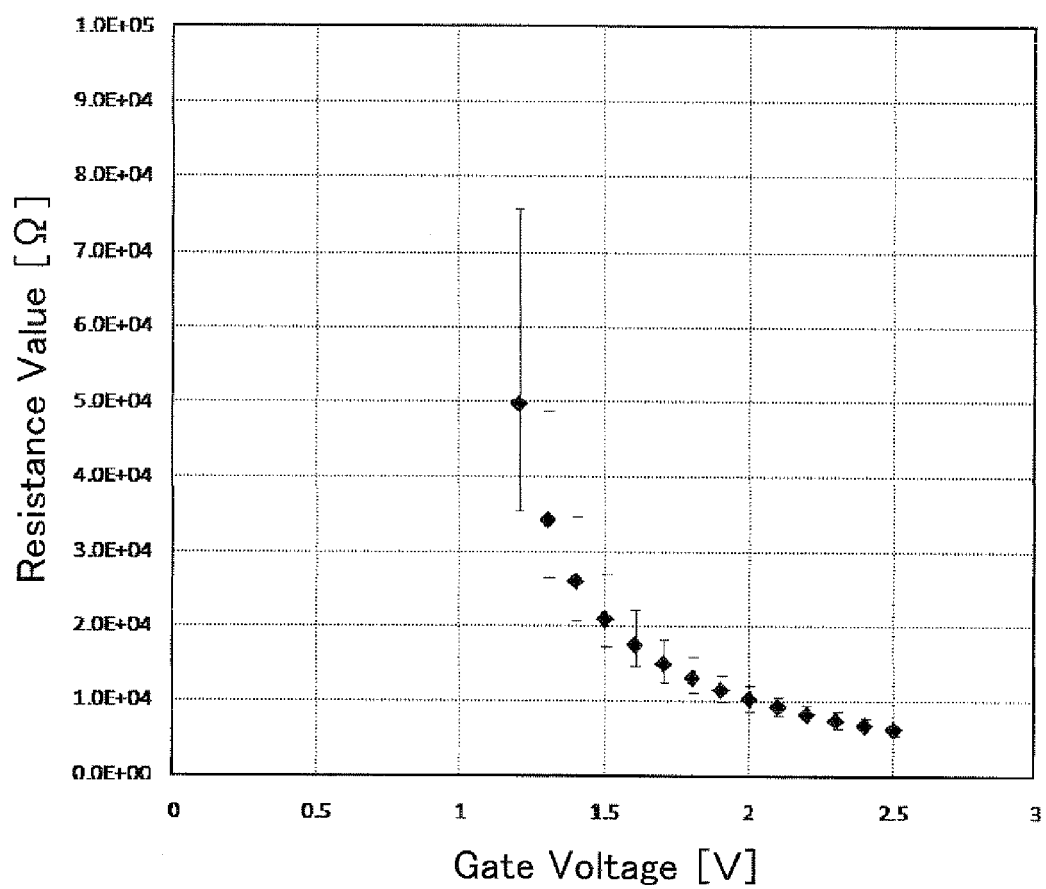
FIG. 3 is a diagram showing dependency on a gate voltage of a transistor controlling current flowing in the variable resistance element upon forming in a resistance value distribution after a forming process of the variable resistance element of the present invention.
Figure 4:
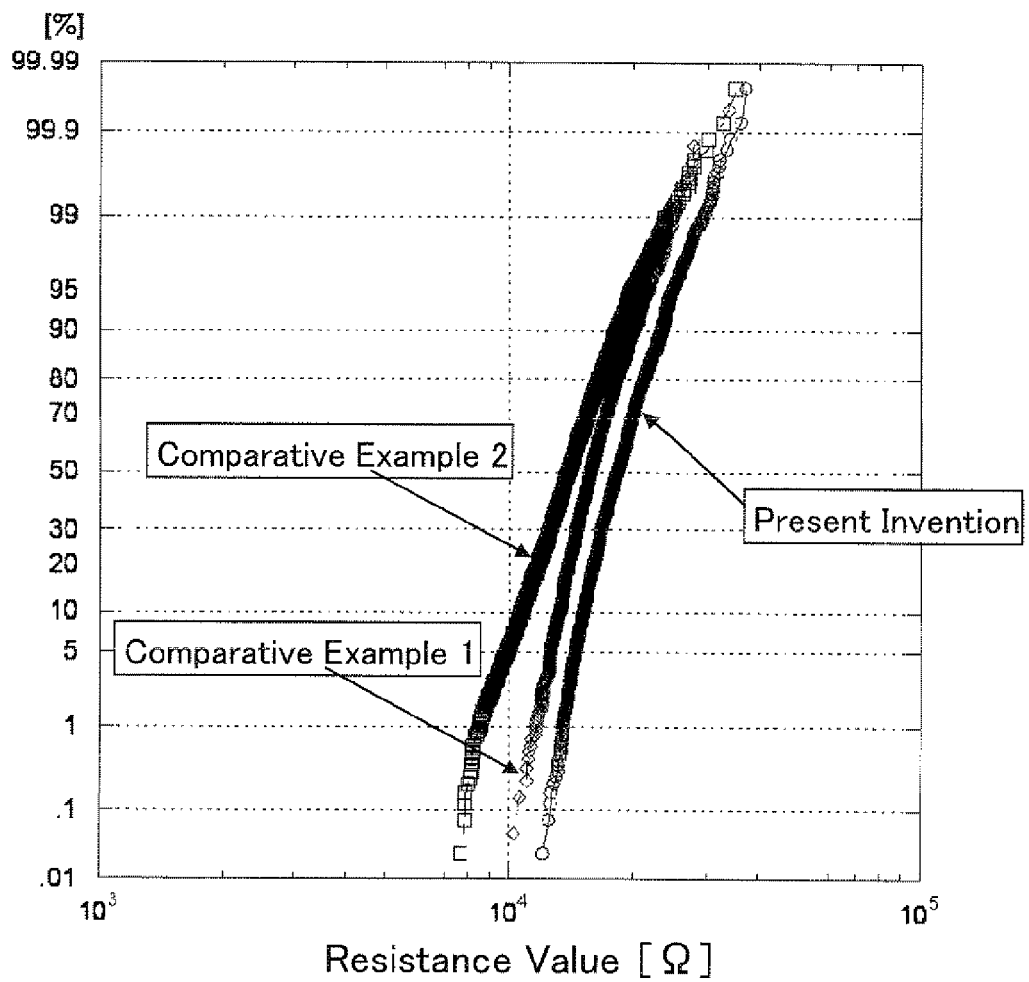
FIG. 4 is a cumulative frequency distribution diagram showing the variation in the resistance values after the forming process for the variable resistance elements of the present invention and elements of comparative examples 1 and 2.

Next, as for each of the variable resistance element 2 of the present invention and the comparative examples 1 and 2, the forming process was performed by applying a voltage pulse of 5 V for 50 μsec while controlling the current flowing in the respective elements by serially connecting the NMOS transistor. A graph showing a distribution variation of the resistance values after the forming process with respect to a gate-applied voltage Vg of the transistor is shown in FIG. 3 for the element of the present invention. Note that, in FIG. 3, a range of an error bar is a range in which the cumulative frequency distribution of the resistance values occupies 10% to 90%, and has a center at an intermediate value is position where the cumulative frequency distribution becomes 50%). From FIG. 3, it can be said that, as the current flowing in the element becomes larger by increasing the gate-applied voltage, the element after the forming process lowers its resistance, and thus the variation in the resistance values can be suppressed. FIG. 4 shows a cumulative frequency distribution of resistance values of respective elements at a particular gate voltage Vg. The variable resistance elements 2 of the present invention and the elements of the comparative example 1 are have about the same degree of element variation, and the elements of the comparative example 2 have larger variation than those.

Figure 5:
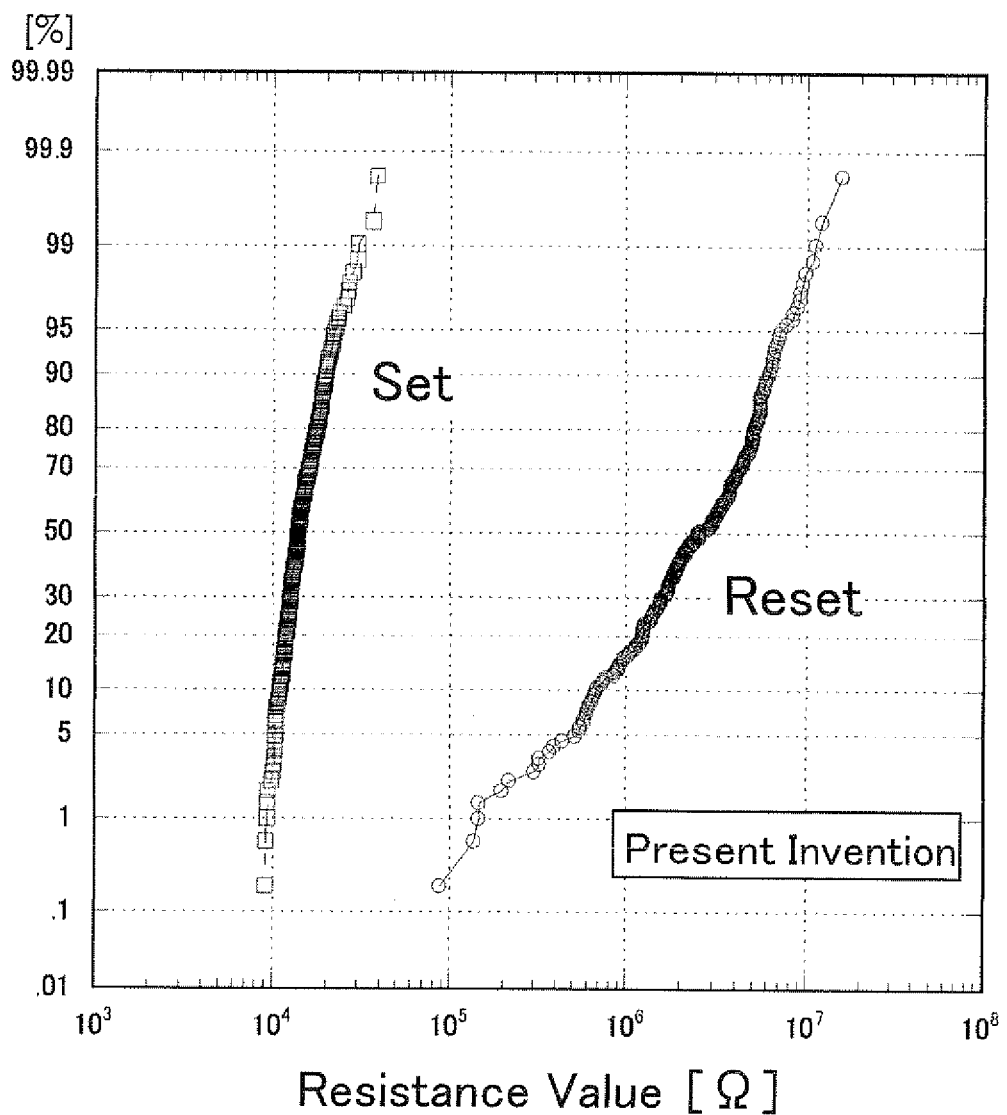
FIG. 5 is a cumulative frequency distribution diagram showing the variation in the resistance values after setting and after resetting for the variable resistance elements of the present invention.
Figure 6:
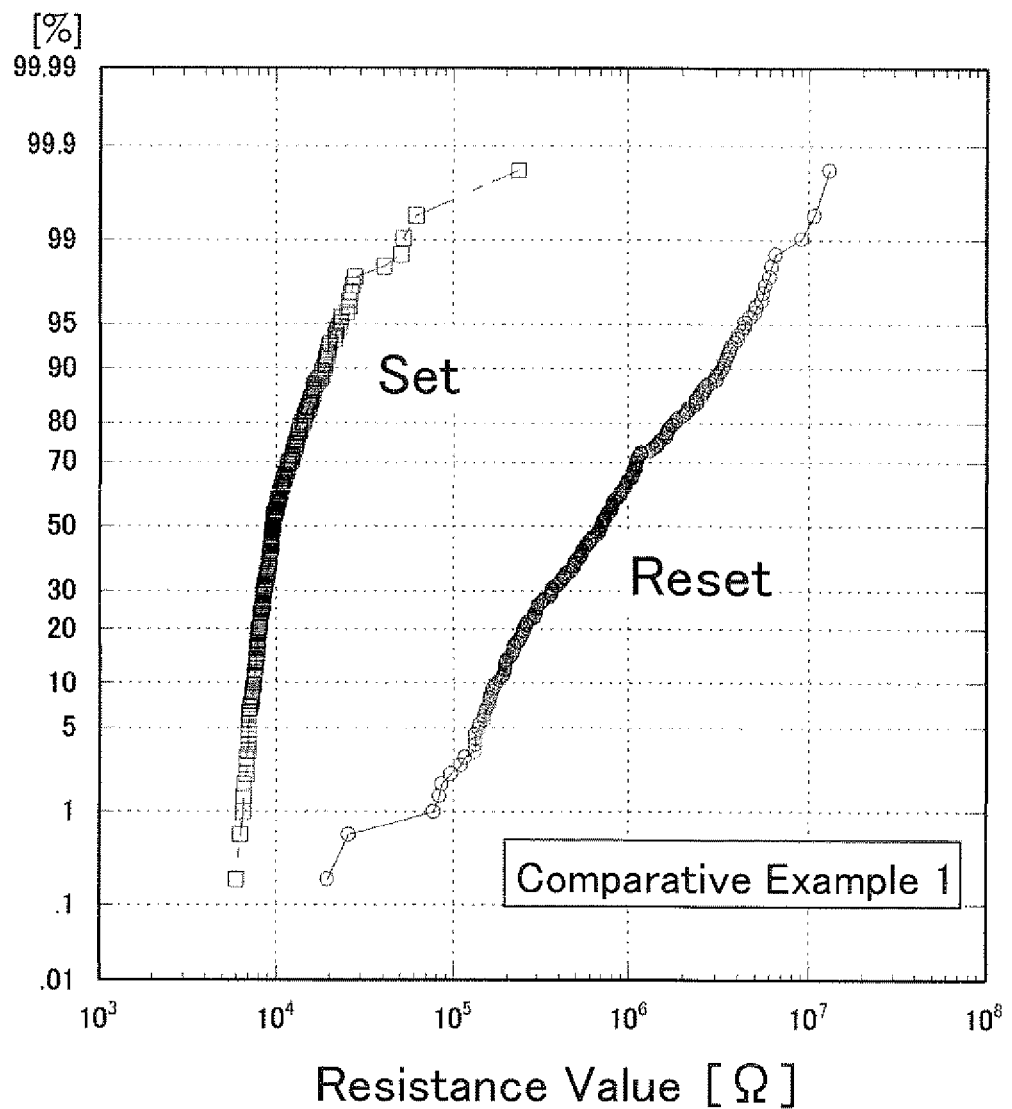
FIG. 6 is a cumulative frequency distribution diagram showing the variation in the resistance values after setting and after resetting for the elements of the comparative example 1.
Figure 7:
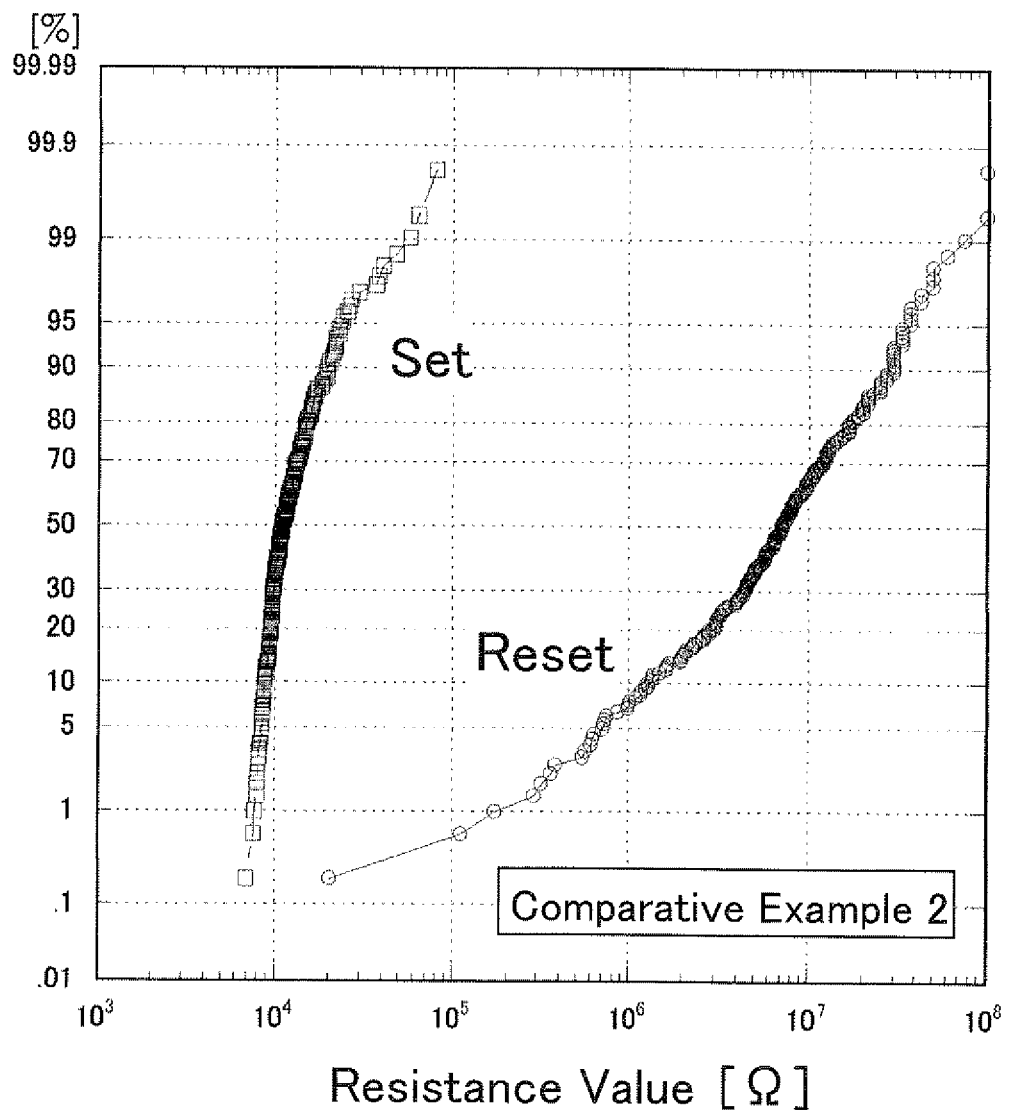
FIG. 7 is a cumulative frequency distribution diagram showing the variation in the resistance values after setting and after resetting for the element of the comparative example 2.

Next, the three types of the elements after the forming process are switched under various voltage pulse conditions, and a cumulative frequency distribution of the resistance values after setting each element of 255 bits and a cumulative frequency distribution of the resistance values after resetting each element of 255 bits under a condition with the least variation are shown in FIGS. 5 to 7. It can be seen that the elements of the present invention have the least variation of the resistance values.

The voltage applying conditions of the voltage pulse upon the setting and resetting of the respective elements are shown below. Further, FIGS. 24A and 24B show a voltage current property of the transistors connected to the respective elements.

1. The Variable Resistance Elements of the Present Invention

FIG. 5 set: 5 V, 50 nsec, Vg=1.8 V
reset: −2.1 V, 10 nsec, Vg=9 V

2. Comparative Example 1

FIG. 6 set: 5 V, 50 nsec, Vg=1.6 V
reset: −1.9 V, 30 nsec, Vg=9 V

3. Comparative Example 2

FIG. 7 set: 5 V, 50 nsec, Vg=1.6 V
reset: −2.1 V, 20 nsec, Vg=9 V

Figure 8:
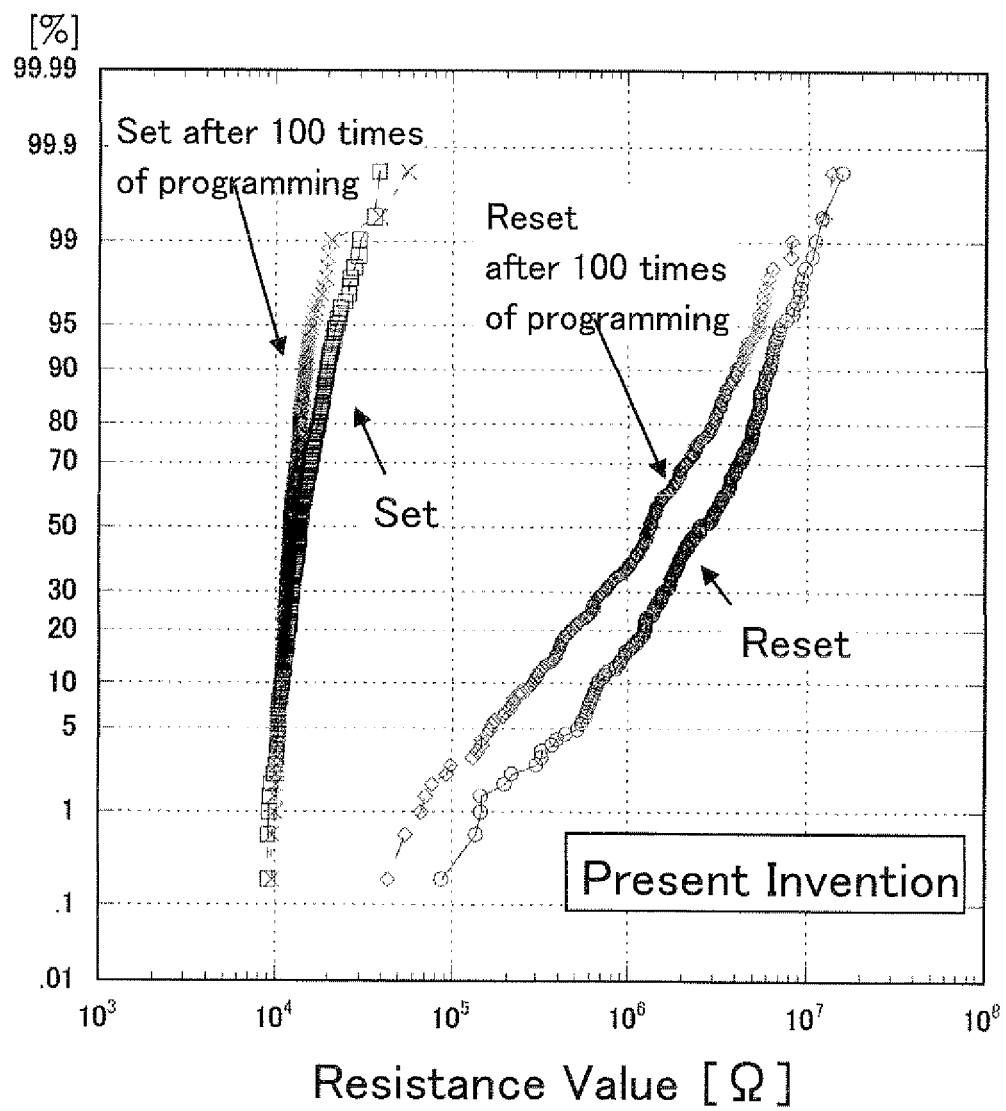
FIG. 8 is a cumulative frequency distribution diagram showing the variation in the resistance values after setting and after resetting, after 100 times of programming, for the variable resistance elements of the present invention.
Figure 9:
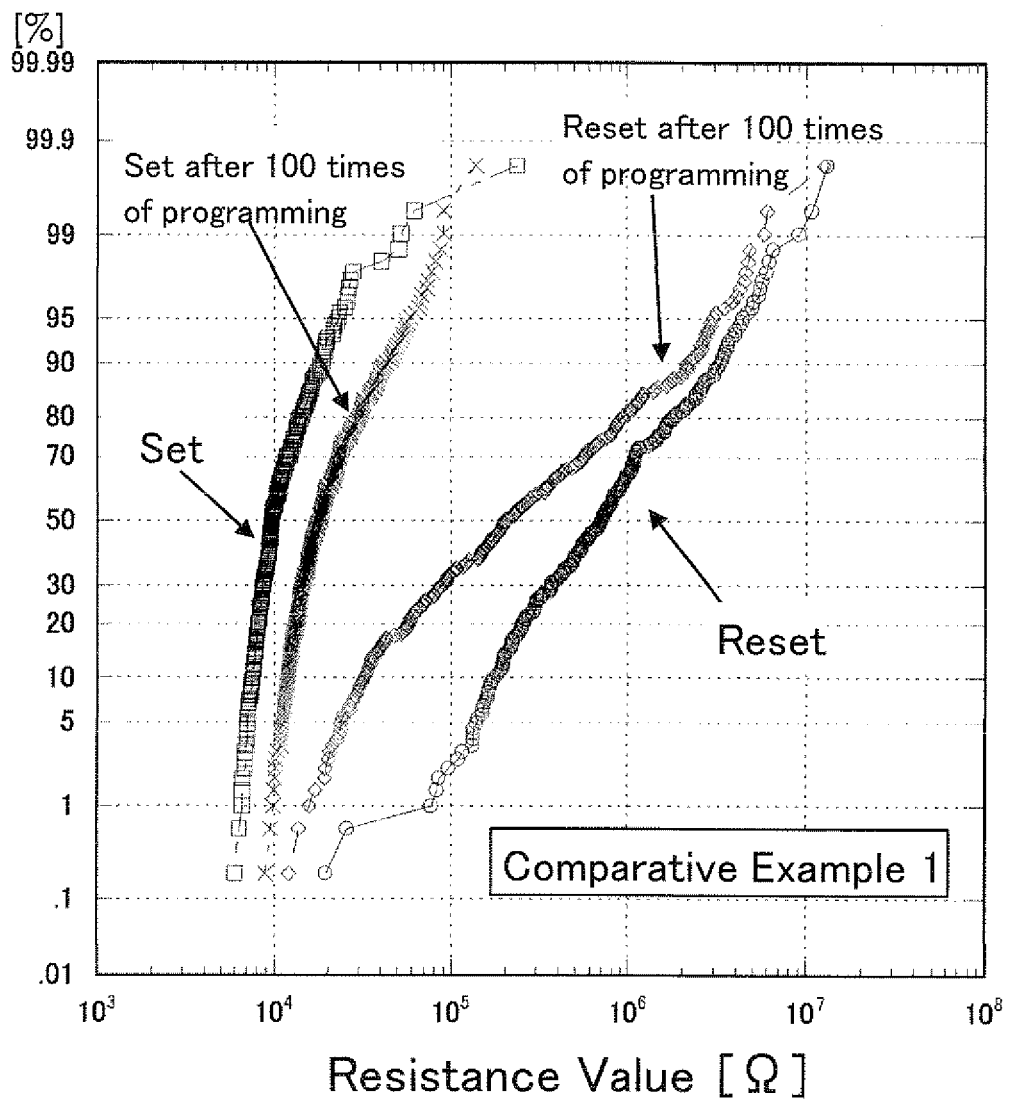
FIG. 9 is a cumulative frequency distribution diagram showing the variation in the resistance values after setting and after resetting, after 100 times of programming, for the elements of the comparative example 1.
Figure 10:
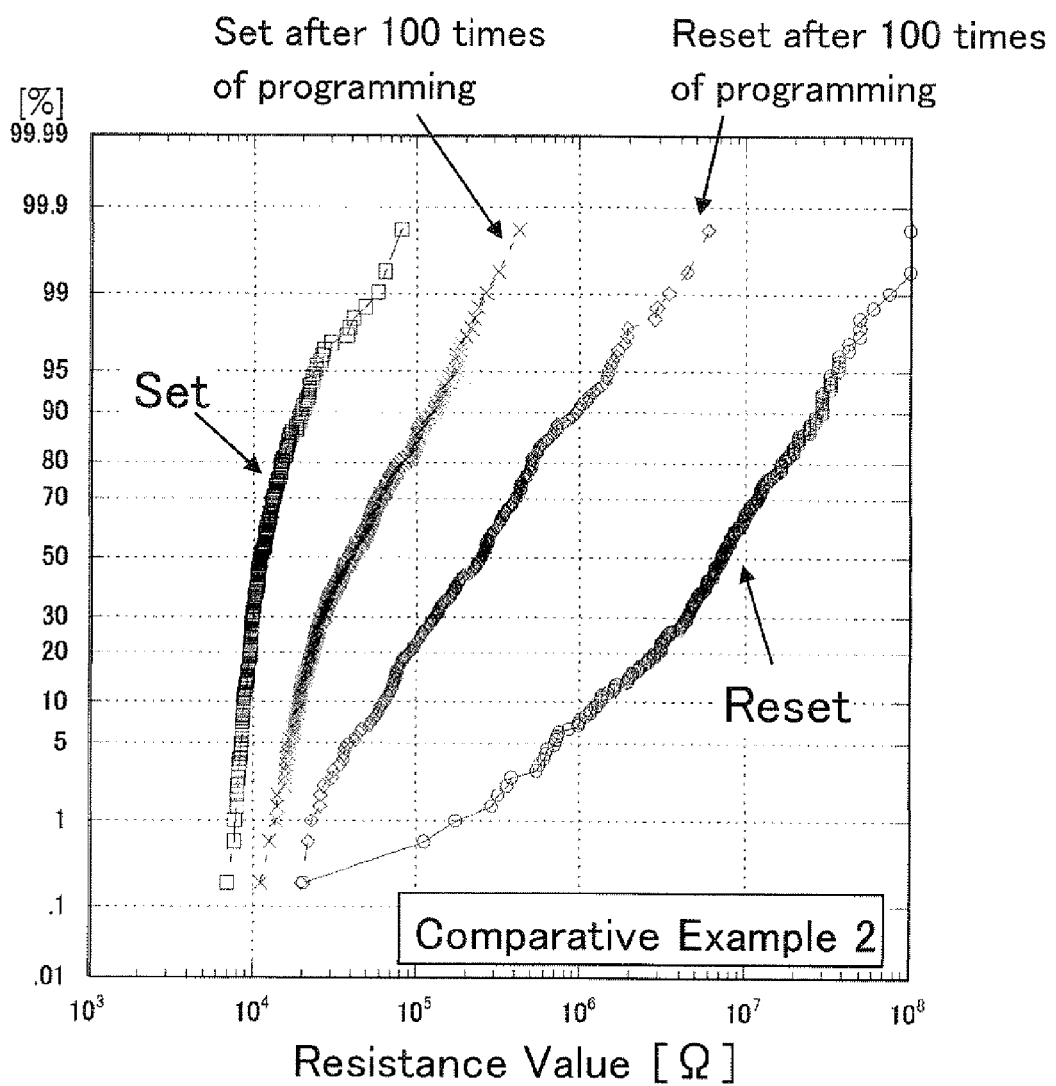
FIG. 10 is a cumulative frequency distribution diagram showing the variation in the resistance values after setting and after resetting, after 100 times of programming, for the elements of the second comparative example.

Further, a cumulative frequency distribution of resistance values after setting of these three types of the elements and a cumulative frequency distribution of resistance values after resetting of them after having switched for 100 times under the above voltage applying conditions are shown in FIG. 8 to FIG. 10. It can be seen that the elements of the present invention have the least variation in the resistance values, and exhibit an improvement in a writable number.

Figure 11:
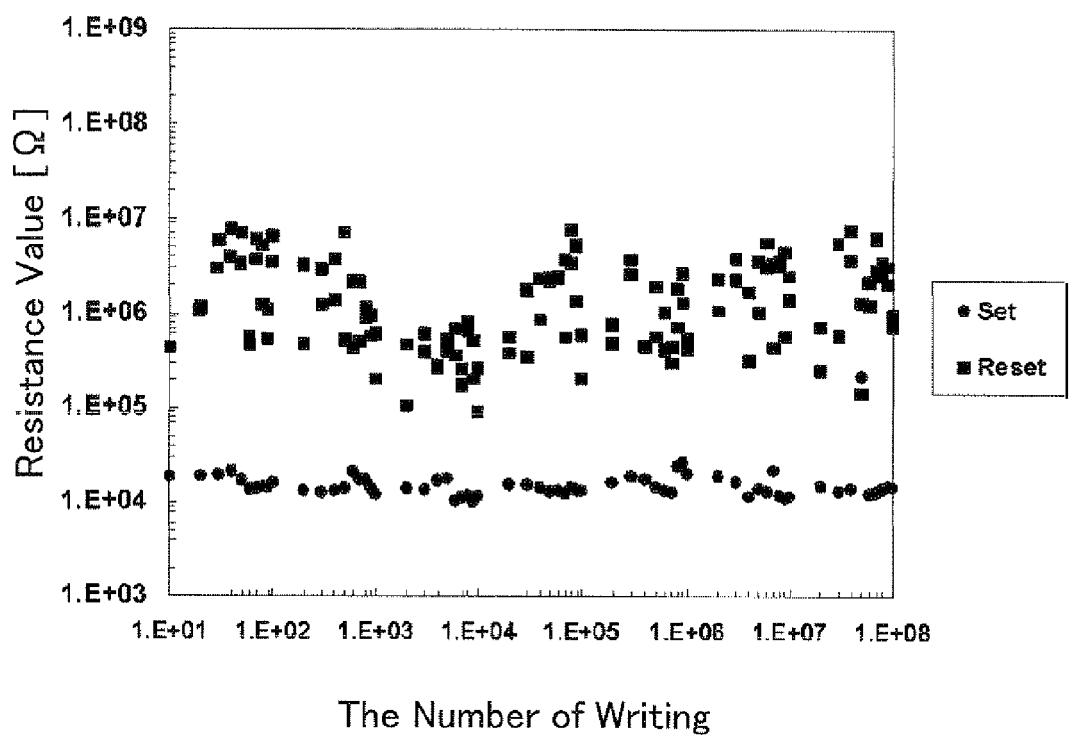
FIG. 11 is a diagram showing write durability of the variable resistance elements of the present invention.

In actually having measured the number of times the variable resistance elements of the present invention can be written, as shown in FIG. 11, it can be seen that the variable resistance elements are writable up to $10^8$ times.

Figure 12A:
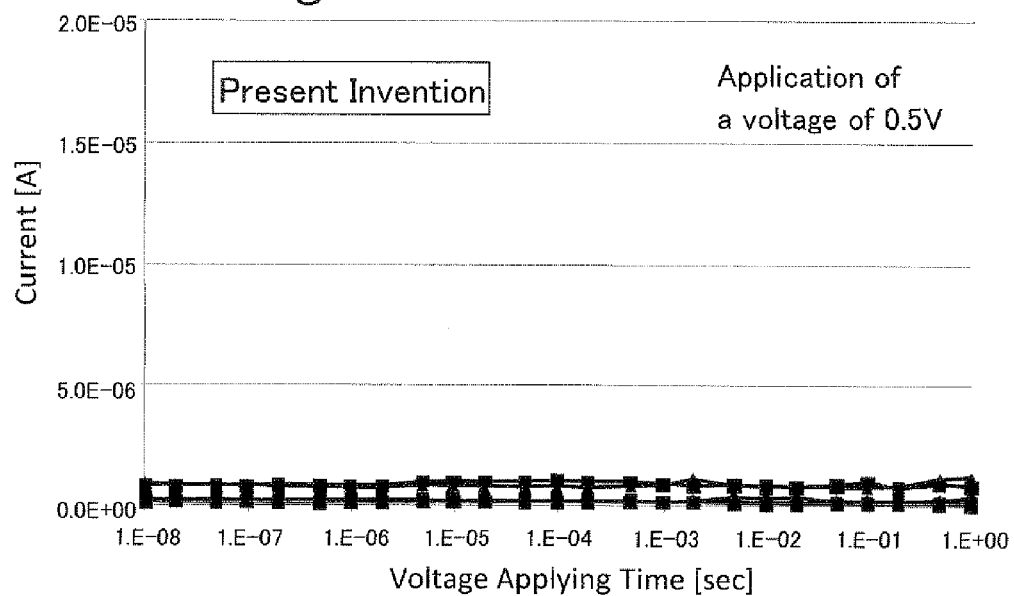
FIGS. 12A and 12B are diagrams showing read disturb durability of each element in a case of performing reading by applying 0.5 V as read voltage for the variable resistance element of the present invention and the element of the comparative example 2.
Figure 12B:
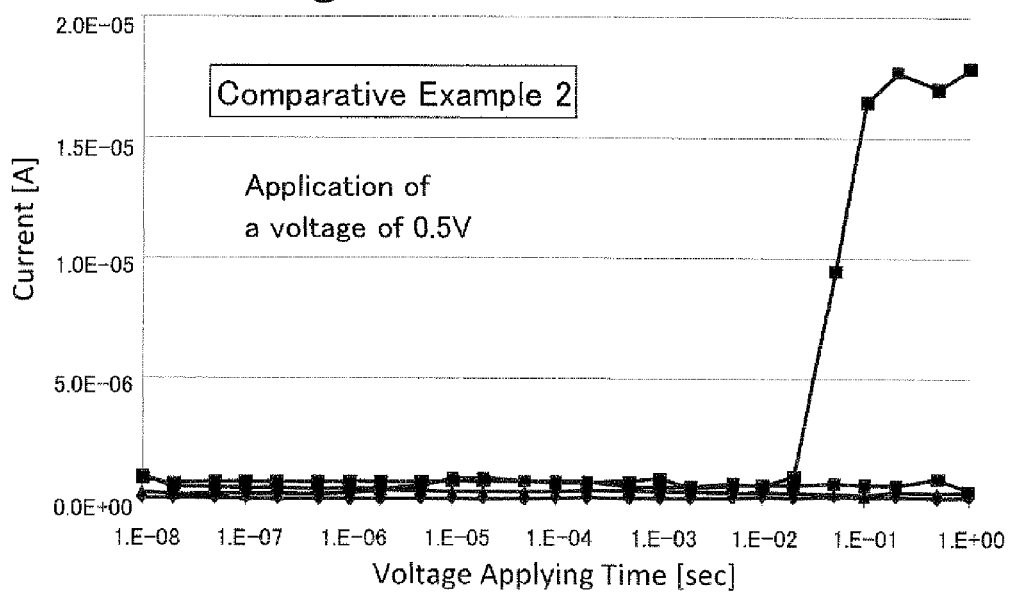

Next, with respect to the variable resistance elements of the present invention, a data retaining property relative to a voltage applying time of having applied a voltage of 0.5 V as a biasing condition upon reading in a reset state for respective elements of 5 bits is shown in FIG. 12A. Similarly, with respect to the elements of the comparative example 2, a data retaining property relative to the voltage applying time of having applied the voltage of 0.5 V as the biasing condition upon reading for respective elements of 5 bits is shown in FIG. 12B. Note that, in FIGS. 12A and 12B, since the graph of the data retaining property of one element among the elements of 5 bits overlaps with the graphs of other elements, it cannot be distinguished from the drawings. Contrary to the read disturb having occurred for the elements of the comparative example 2 when the voltage applying time exceeds 10 msec, in the variable resistance elements of the present invention, the read disturb was not observed even when the voltage applying time exceeded 1 sec.

From FIGS. 12A and 12B, it can be seen that the variable resistance elements of the present invention are also improved in regard to the read disturb.

Note that, although the element structure shown in FIG. 1 is exemplified as the structure of the variable resistance element 2 of the present embodiment, the present invention is not limited to the elements having such a structure. For example, as shown in FIG. 13, the structure may have a variable resistance element 3 embedded in an opening portion penetrating the interlayer insulating film.

Figure 13:
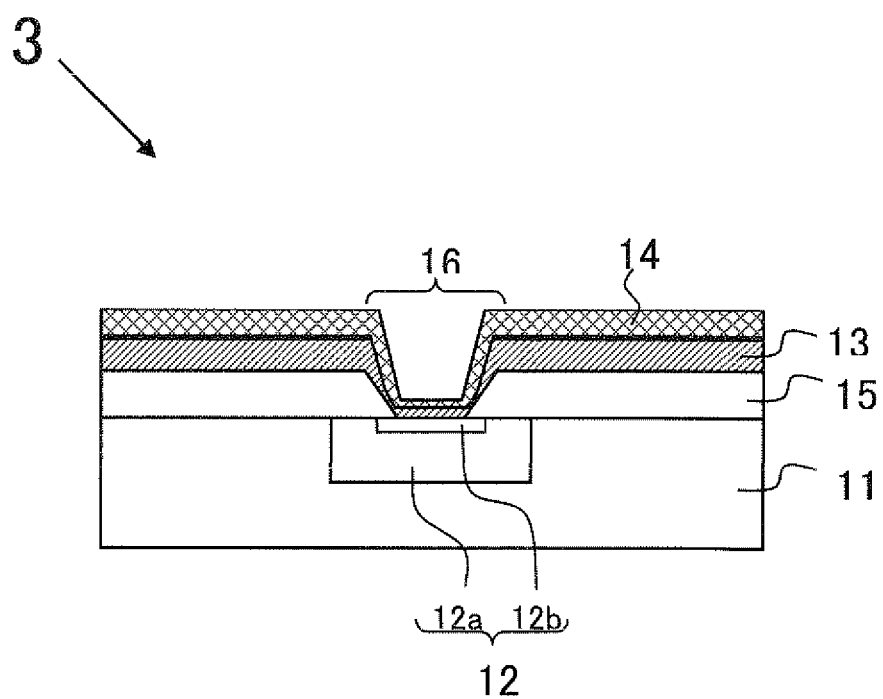
FIG. 13 is a schematic cross-sectional diagram of an element structure showing another structural example of the variable resistance elements of the present invention.

The variable resistance element 3 shown in FIG. 13 includes an opening portion 16 penetrating an interlayer insulating film 15 formed on the first electrode material 12, the resistance changing layer 13 covering an inner surface and a bottom surface of the opening portion 16, and the second electrode 14 covering the resistance changing layer 13 inside the opening portion. The resistance changing layer 13 comes into contact with the buffer layer 12b at a bottom part of the opening portion 16, and connects with the first electrode 12a via the buffer layer 12b. The buffer layer 12b is formed of the oxide of the metal configuring the first electrode, and is formed by the oxidation of the first electrode material 12.

Hereinafter, a method of manufacturing the variable resistance element 3 is shown. First, a groove with a pattern of the first electrode is formed on the insulating layer (silicon oxide film) 11, and an inside of the groove is filled with the first electrode material 12 (e.g., titanium nitride). Thereafter, the interlayer insulating film 15 is deposited over the first electrode material 12, the opening portion 16 penetrating the interlayer insulating film 15 is formed, and the first electrode material 12 is exposed at the bottom part of the opening portion 16. Then, the first electrode material (titanium nitride) 12 exposed at the bottom part of the opening portion 16 is oxidized for about 2 to 5 nm by a method such as oxygen ashing or the like, and the titanium oxide as the buffer layer 12b is formed. Thereafter, hafnium oxide is formed for about 2 to 5 nm as the resistance changing layer 13 by the ALD, and tantalum is deposited for about 10 nm as the second electrode material 14. Thereafter, the second electrode material 14 and the resistance changing layer 13 are patterned according to a memory circuit and are processed.

Figure 14:
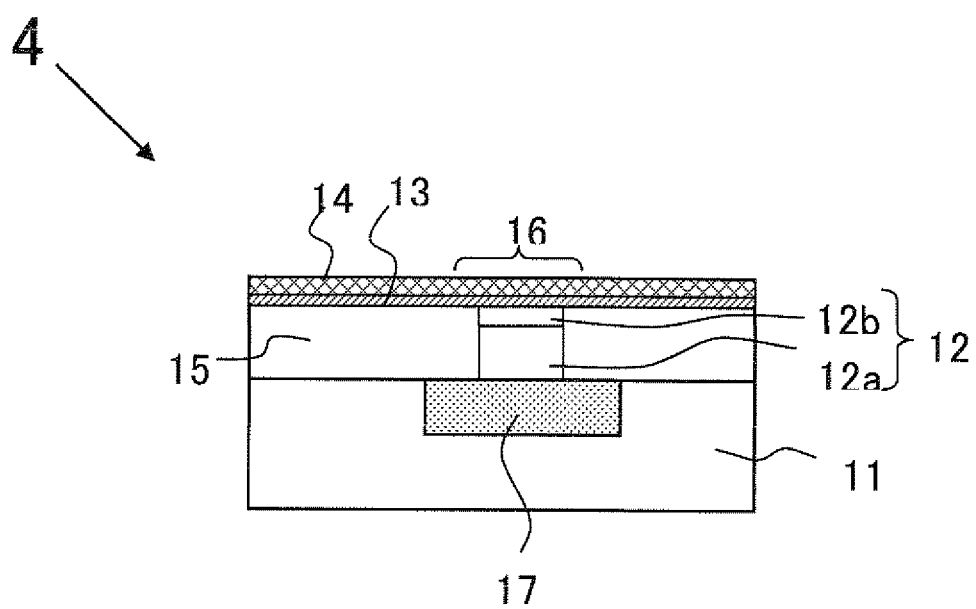
FIG. 14 is a schematic cross-sectional diagram of an element structure showing another structural example of the variable resistance elements of the present invention.

Further, a variable resistance element 4 shown in FIG. 14 is formed in such a manner that the opening portion 16 penetrating the interlayer insulating film 15 is formed on a wiring layer 17 of a lower layer, and an inside of the opening portion 16 is filled by the first electrode material 12 (titanium nitride). At an upper part of the opening portion 16, the buffer layer 12b having the film thickness of about 2 to 5 nm configured of titanium oxide is formed, for example, by oxidizing the upper surface of the first electrode material 12 within the opening portion by a method such as the oxygen asking. The resistance changing layer 13 formed of hafnium oxide having the film thickness of about 10 nm is deposited by the ALD method so as to cover the upper surface of the buffer layer 12b, and the second electrode 14 made of a tantalum film having the film thickness of about 10 nm is deposited on the resistance changing layer 13 by the ALD method, and they are patterned according to the memory circuit and processed.

Figure 15:
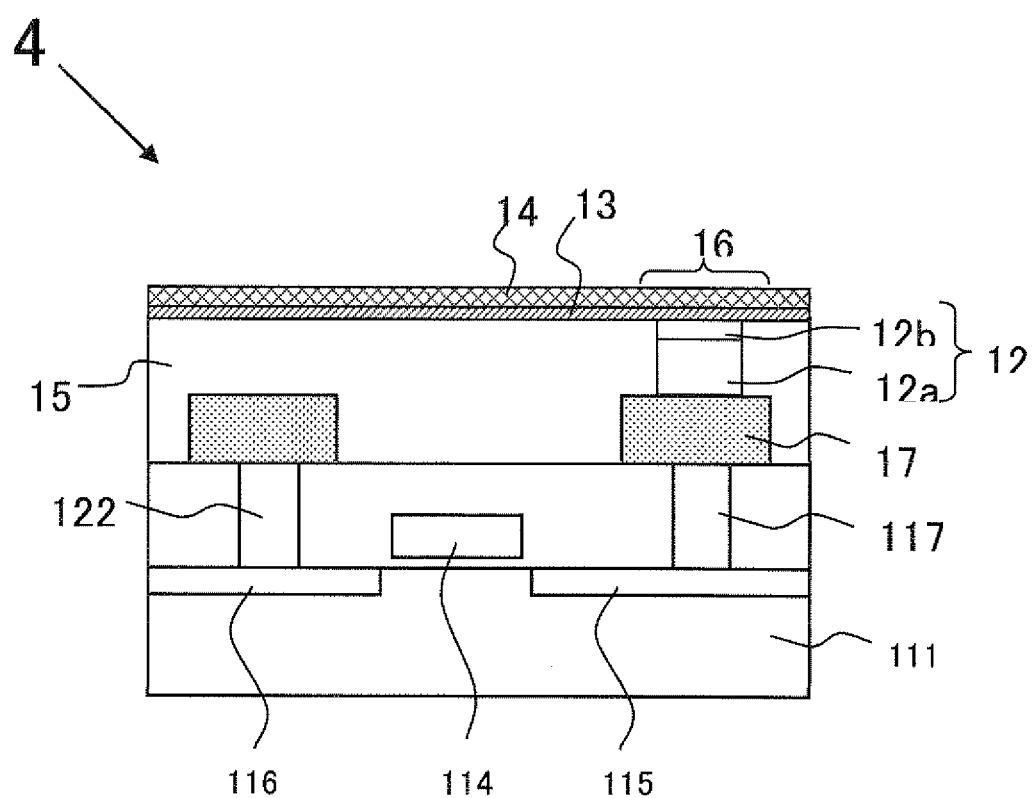
FIG. 15 is a schematic cross-sectional diagram of an element structure showing another structural example of the variable resistance elements of the present invention.

Note that, as shown in FIG. 15, the wiring layer 17 may be connected with a drain region 115 of a selection transistor formed on a substrate 111 via a contact plug 117 so as to connect the variable resistance element 4 with the selection transistor.

By installing the memory cell array in which a plurality of the variable resistance elements 2 to 4 of the present invention are arranged in at least one direction of a column direction and a row direction, the property variation among the variable resistance elements is reduced, and a highly reliable non-volatile semiconductor memory device capable of performing a stable switching operation can be realized.

Second Embodiment

Figure 16:
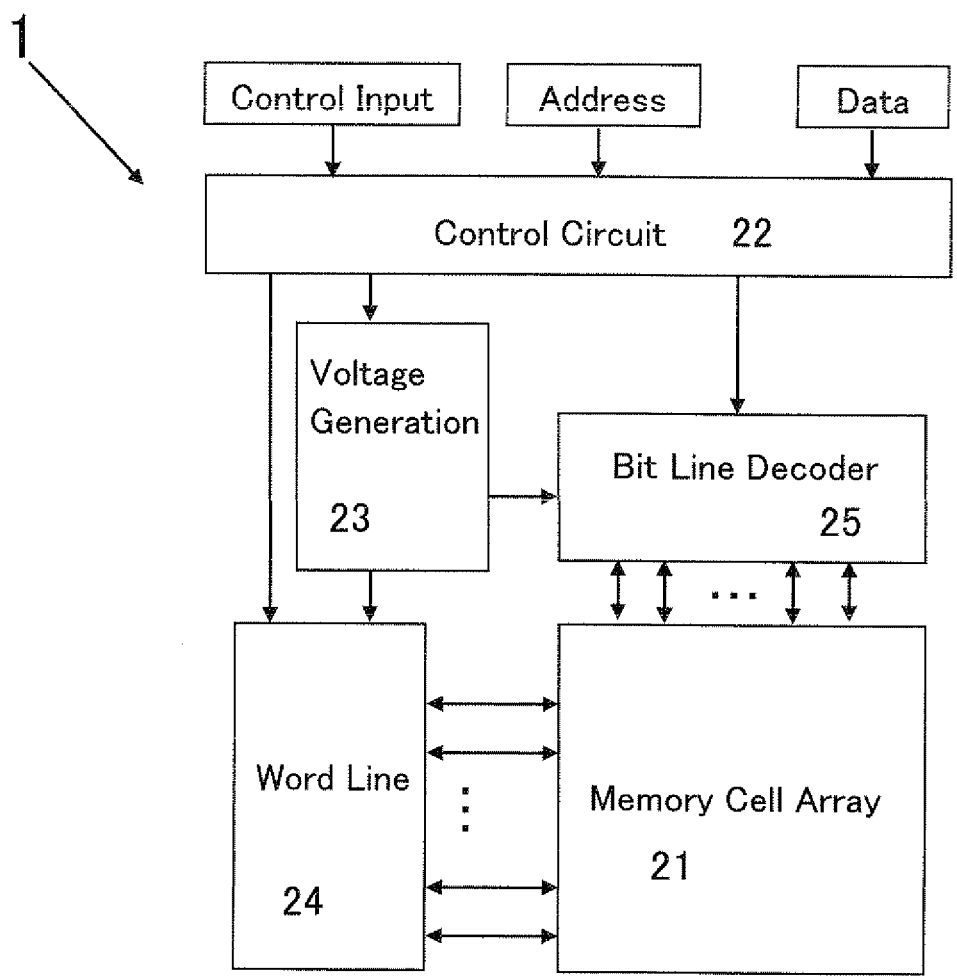
FIG. 16 is a diagram showing an example of a circuit configuration of a non-volatile semiconductor memory device according to the present invention.
Figure 17:
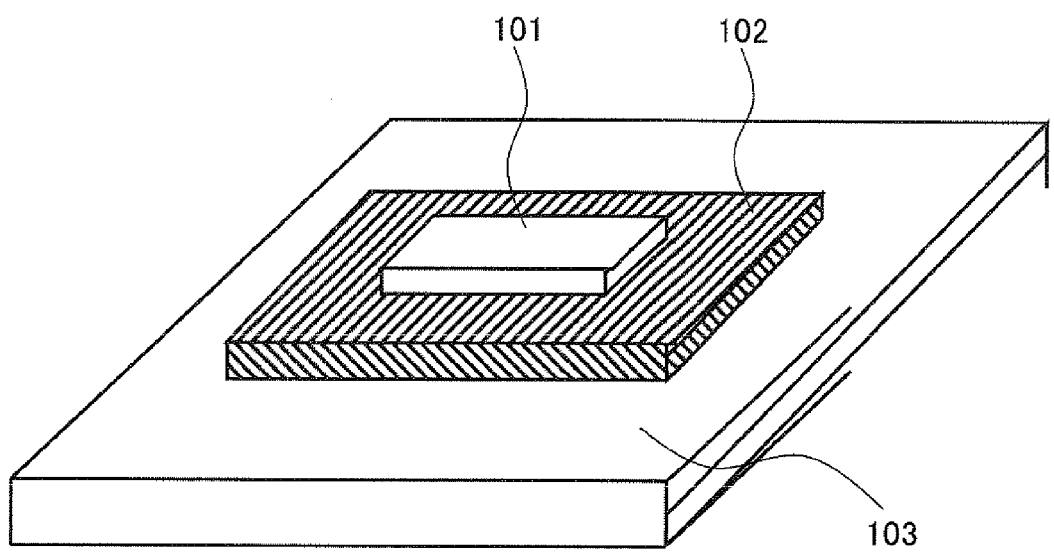
FIG. 17 is a schematic diagram showing an element structure of a variable resistance element of a conventional configuration.
Figure 18:
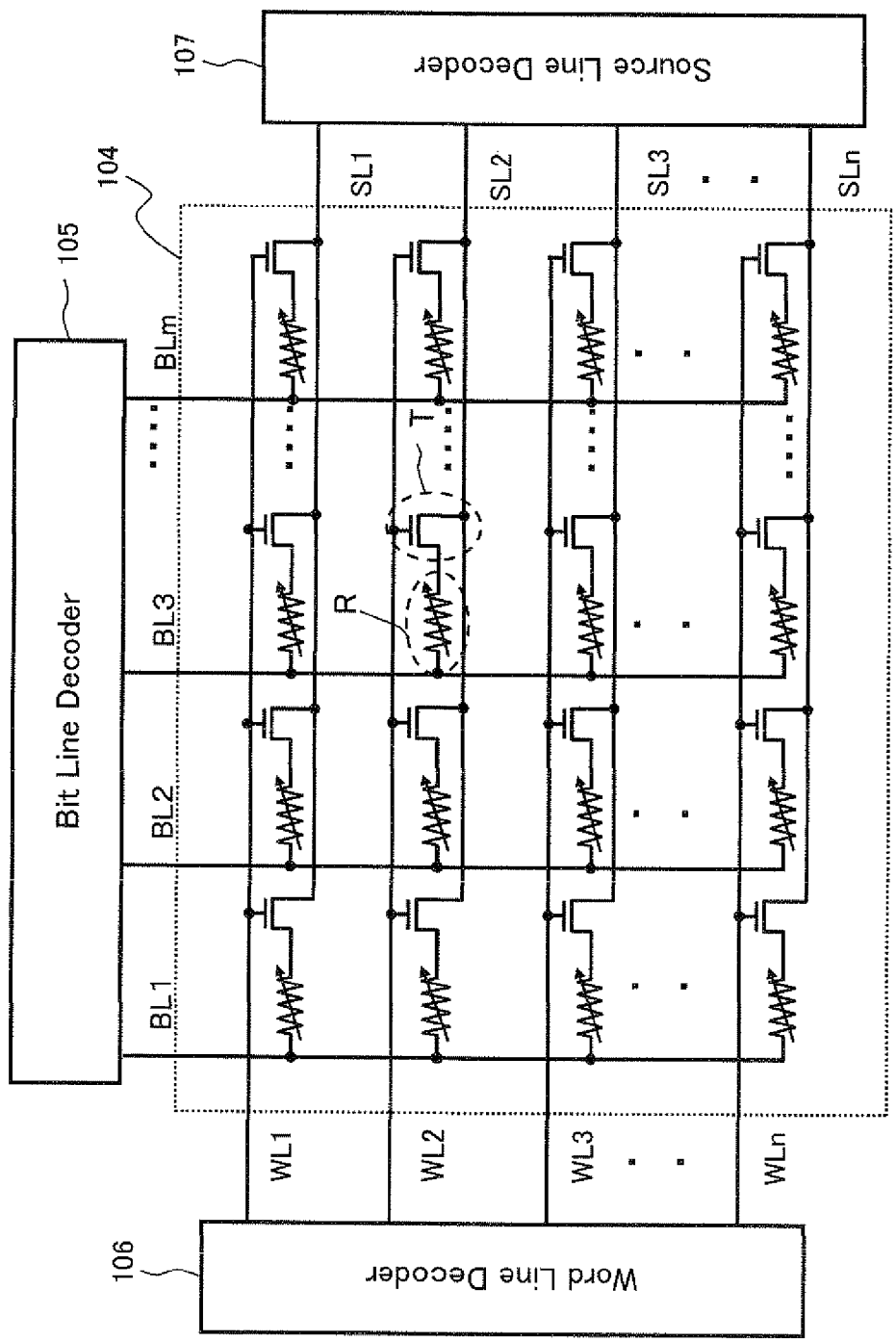
FIG. 18 is an equivalent circuit diagram showing a configuration example of a 1T1R type memory cell.
Figure 19:
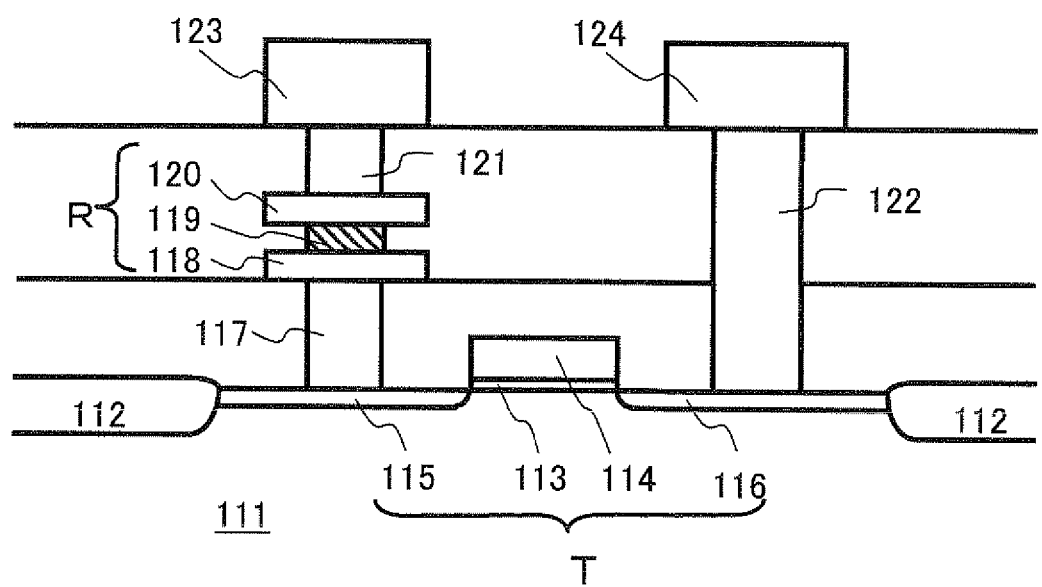
FIG. 19 is a schematic cross-sectional diagram showing the 1T1R type memory cell.
Figure 20:
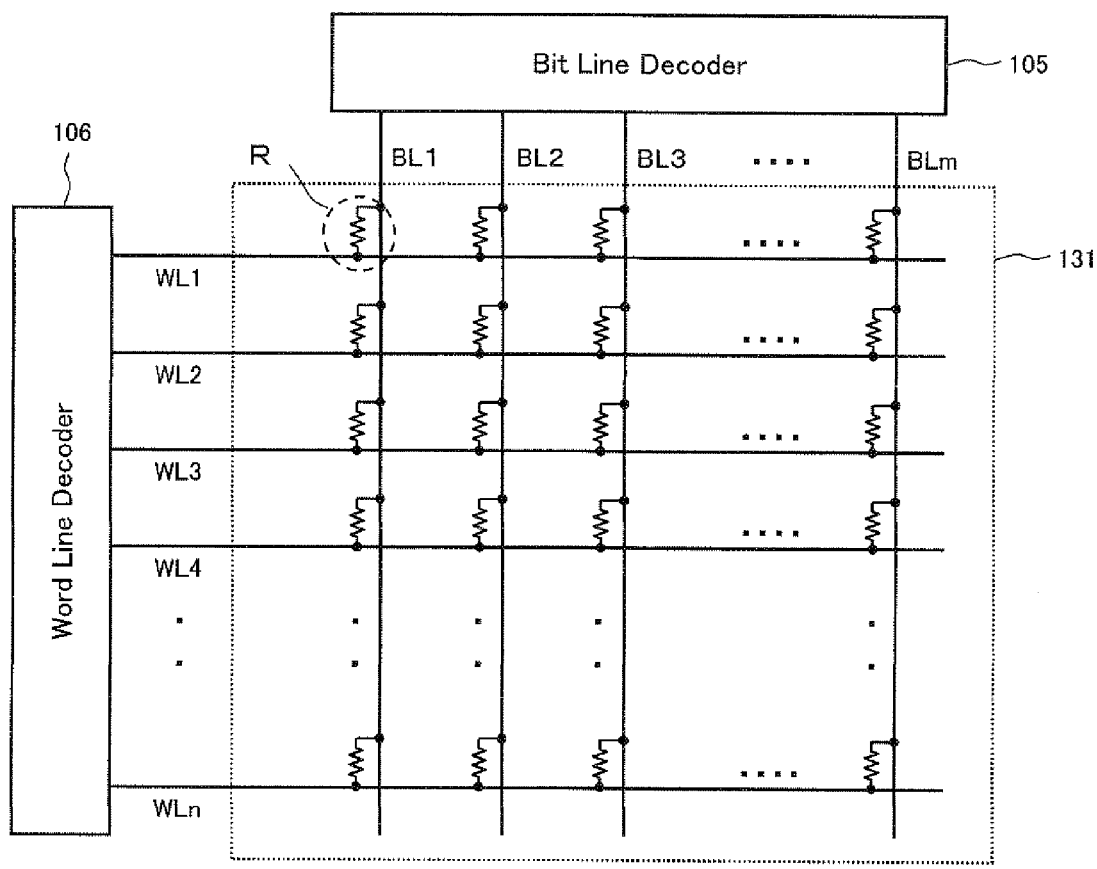
FIG. 20 is an equivalent circuit diagram of a configuration example of a 1R type memory cell.
Figure 21:
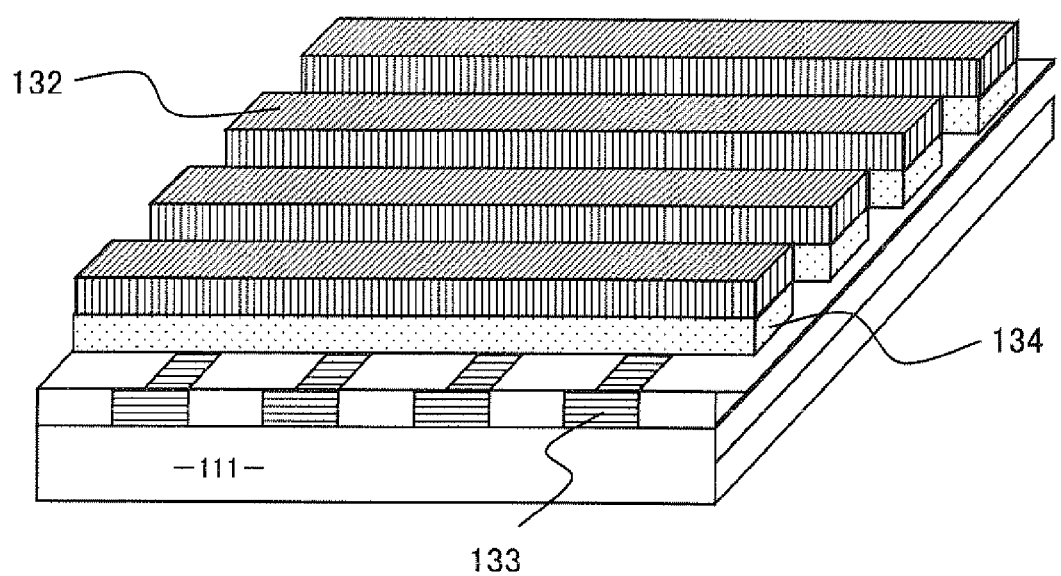
FIG. 21 is a schematic cross-sectional diagram of the 1R type memory cell.
Figure 22A:
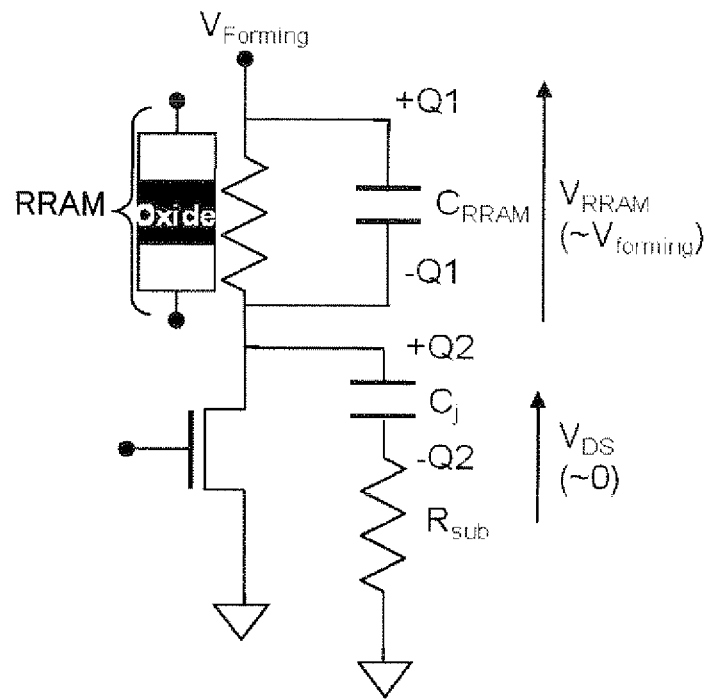
FIGS. 22A and 22B are diagrams showing a circuit configuration of a circuit that performs a forming process of a variable resistance element used for verification of an effect of the present invention.
Figure 22B:
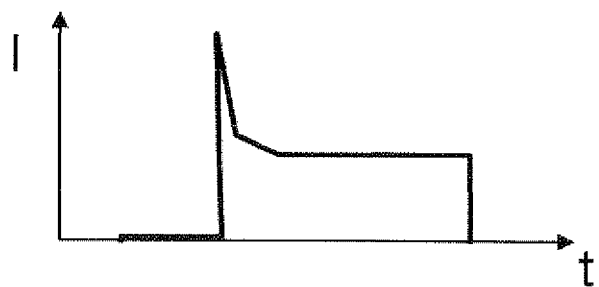
Figure 23:
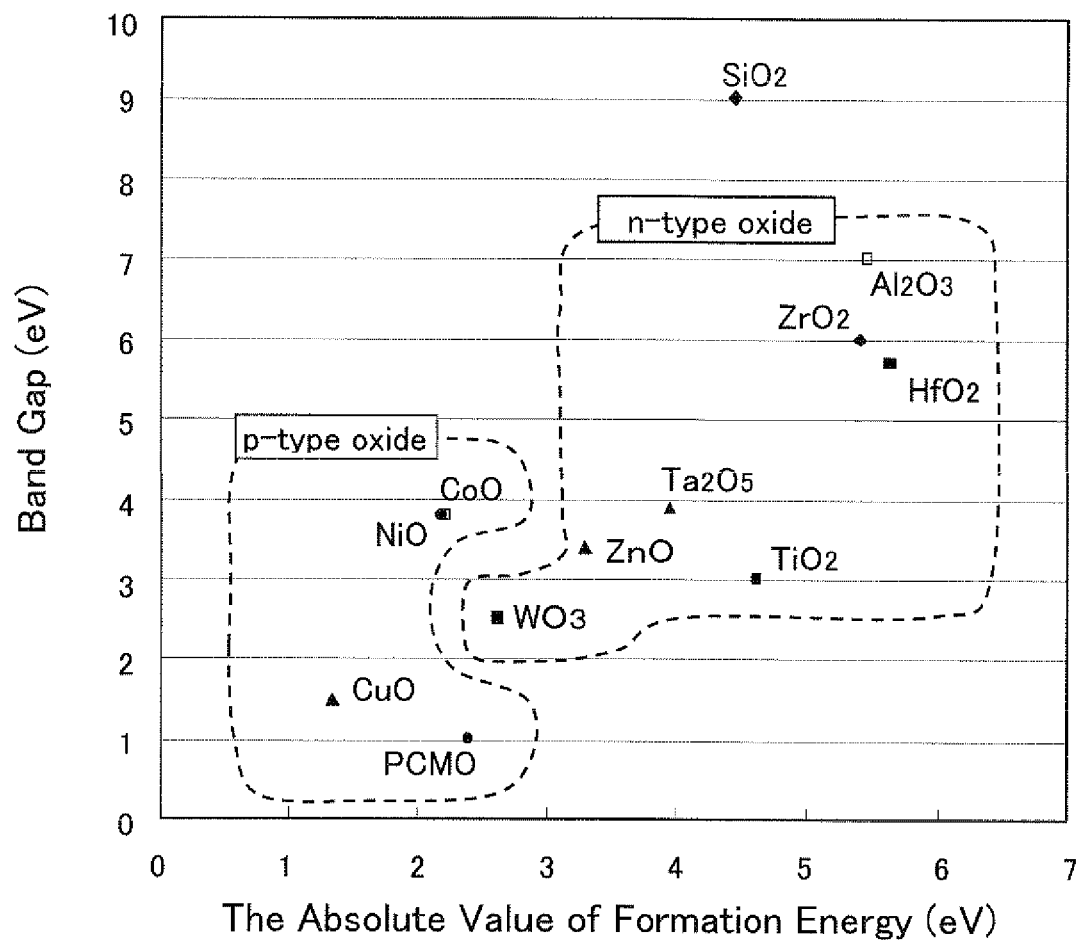
FIG. 23 is a diagram for describing a relationship of a band gap and formation energy of an oxide of the metal oxide.

FIG. 16 shows an example of the non-volatile semiconductor memory device provided with the variable resistance elements 2 to 4. FIG. 16 is a circuit configuration diagram of the present invention device 1, and includes a memory cell array 21, a control circuit 22, a voltage generating circuit 23, a word line decoder 24, and a bit line decoder 25.

The memory cell array 21 is a well-known cross-point memory cell array in which a plurality of memory cells including one of the variable resistance elements 2 to 4 are arranged in the column and row directions respectively in a matrix, the memory cells belonging to the same column are mutually connected by the bit line extending in the column direction, and the memory cells belonging to the same row are mutually connected by the word line extending in the row direction. By respectively applying one of a selected word line voltage and an unselected word line voltage via the word line and one of a selected bit line voltage and an unselected bit line voltage via the bit line, one or a plurality of memory cells that is the operation target specified by an address inputted from the outside can be selected upon the respective operation of programming, erasing, reading, and forming process.

Further, the memory cell array 21 may be one of a memory cell array with a 1R structure not including a current limiting element in a unit memory cell, or a memory cell array with a 1D1R structure including a diode as the current limiting element in the unit memory cell, or a memory cell array with a 1T1R structure including a transistor as the current limiting element in the unit memory cell. In the memory cell array with the 1D1R structure, one terminal of the diode and one electrode of the variable resistance element are serially connected so as to configure the memory cell, and one of the other terminal of the diode and the other electrode of the variable resistance element is connected with one of the bit line and the word line, respectively. In the memory cell array with the 1T1R structure, one of a source and drain of the transistor and one electrode of the variable resistance element are serially connected so as to configure the memory cell, and one of the other of the source and the drain of the transistor not connecting with the variable resistance element and the other electrode of the variable resistance element not connected with the transistor is connected with the bit line extending in the column direction, and the other thereof is connected with the common source line for supplying a ground voltage, and gate terminals of the transistors are connected with the word line extending in the row direction.

The control circuit 22 performs control of the respective memory operations of the programming (setting), erasing (resetting), and reading of the memory cell array 21, as well as control of the forming process. Specifically, the control circuit 22 controls the word line decoder 24 and the bit line decoder 25 based on address signals inputted from an address line, data inputs inputted from a data line, and control input signals inputted from a control signal line, thereby controlling the respective memory operations and the forming process of the memory cell.

Upon the respective memory operations of the programming (setting), erasing (resetting), and reading, and the forming process of the memory cell, the voltage generating circuit 23 generates the selected word line voltage and the unselected word line voltage that are necessary for selecting the memory cell of the operation target and supplies the same to the word line decoder 24, and generates the selected bit line voltage and the unselected bit line voltage and supplies the same to the bit line decoder 25.

Upon the respective memory operations of the programming (setting), erasing (resetting), and reading, and the forming process of the memory cell, when a memory cell that is the operation target is specified by being inputted to the address line, the word line decoder 24 selects a word line corresponding to the address signal inputted to the address line, and applies the selected word line voltage and the unselected word line voltage to the selected word line and the unselected word lines, respectively.

Upon the respective memory operations of the programming (setting), erasing (resetting), and reading, and the forming process of the memory cell, when the memory cell that is the operation target is specified by being inputted to the address line, the bit line decoder 25 selects a bit line corresponding to the address signal inputted to the address line, and applies the selected bit line voltage and the unselected bit line voltage to the selected bit line and the unselected bit lines, respectively.

Especially, upon the forming process, by controlling an on-resistance or the like of a switching transistor for selecting a word line or a bit line in the word line decoder 24 or the bit line decoder 25, or by controlling an on-resistance of the transistor using the selected word line voltage in the memory cell array with the 1T1R structure, the amount of current flowing in the variable resistance element during the forming is limited. When the forming process is completed, as described above, a sharp current that cannot be controlled by the transistor may flow accompanying the rapid decrease of the resistance value of the variable resistance element. As a result, the property variation among the variable resistance elements in the memory cell array is caused, and it becomes difficult to realize a non-volatile memory device with high reliability.

However, in the present invention device 1, by configuring the memory cell array using the variable resistance elements 2 to 4 including the buffer layers, since the sharp spike current that flows in the variable resistance element after the completion of the forming process is suppressed, the property variation among the variable resistance elements in the memory cell array is reduced, and a highly reliable non-volatile memory device can be realized.

Note that, since the detailed circuit configurations, the device structures and the methods of manufacture of the memory cell array 21, the control circuit 22, the voltage generating circuit 23, the word line decoder 24, and the bit line decoder 25 can be realized by using well-known circuit configurations and can be produced by well-known semiconductor manufacturing techniques, the descriptions thereof will be omitted.

In the above embodiment, although the source line is made common for all of the memory cells and the ground voltage is supplied to the source line in the memory cell array with the 1T1R structure, the source line may extend in the column direction, and mutually connect the memory cells belonging to the same column; or may extend in the row direction, and mutually connect the memory cells belonging to the same row. Further, by including a source line decoder 26 (not shown) that applies a selected source voltage and an unselected source voltage supplied from the voltage generating circuit 23 to respective source lines, memory cells as the operation target can be selected by specifying the memory cell for each row or column upon the respective memory operations of the programming (setting), erasing (resetting), and reading, and the forming process of the memory cell. When a memory as the operation target is specified by being inputted to the address line, the source line decoder 26 selects a source line corresponding to the address signal inputted to the address line, and applies the selected source line voltage and the unselected source line voltage to the selected source line and the unselected source lines, respectively.

Further, although the above embodiment illustrates the case in which the memory cell array is the cross-point memory cell array with the 1D1R structure including the diode in the memory cell or the cross-point memory cell array with the 1T1R structure including the transistor in the memory cell, the present invention is not limited to such configurations, and can be adapted to a memory cell array configured by arranging a plurality of memory cells including arbitrary variable resistance elements in the matrix and capable of a memory operation by performing the forming process.

The present invention can be used in a non-volatile semiconductor memory device, and is especially capable of being used in a non-volatile semiconductor memory device including non-volatile variable resistance elements in which their resistance states transitions by voltage application and their resistance states after the transition is maintained in non-volatile manners.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A non-volatile semiconductor memory device using a variable resistance element, which is formed by interposing a resistance changing layer between a first electrode and a second electrode, for storing information, wherein
the variable resistance element is formed by inserting a buffer layer having a fixed resistance value between the resistance changing layer and the first electrode,
the resistance changing layer includes an n-type first metal oxide,
the buffer layer includes an n-type second metal oxide,
energy at a bottom of a conduction band of the first metal oxide is higher than energy at a bottom of a conduction band of the second metal oxide,
the second electrode makes an ohmic contact with the resistance changing layer, and
a work function of the first electrode is larger than a work function of the second electrode.

2. The non-volatile semiconductor memory device according to claim 1, wherein
a band gap of the first metal oxide is larger than a band gap of the second metal oxide.

3. The non-volatile semiconductor memory device according to claim 1, wherein
an absolute value of formation energy of the first metal oxide is larger than an absolute value of formation energy of the second metal oxide.

4. The non-volatile semiconductor memory device according to claim 1, wherein
the buffer layer operates as a resistance that suppresses a rapid increase of current that flows between both of the electrodes of the variable resistance element accompanying completion of a forming process, the forming process changing a resistance state between the first and second electrodes from an initial high resistance state to a variable resistance state, wherein
in the variable resistance state, the resistance state transitions between two or more resistance states by applying an electric stress between the first electrode and the second electrode of the variable resistance element, and one resistance state after the transition is used for storing information.

5. The non-volatile semiconductor memory device according to claim 1, wherein
the resistance changing layer includes an oxide of one element of Hf and Zr.

6. The non-volatile semiconductor memory device according to claim 1, wherein
the buffer layer includes an oxide of one element of Ti, Ta, Zn, Nb, and W.

7. The non-volatile semiconductor memory device according to claim 1, wherein
the first electrode includes one of a Ti nitride, a Ta nitride, and a metal selected from W, Ni, and Co.

8. The non-volatile semiconductor memory device according to claim 1, wherein
the second electrode includes a metal selected from Ti, Ta, Al, Hf, and Zr.

9. The non-volatile semiconductor memory device according to claim 1, wherein
the buffer layer includes an oxide of one of Ti and Ta, and the first electrode includes one of a Ti nitride and a Ta nitride.

10. The non-volatile semiconductor memory device according to claim 1, wherein
the variable resistance element includes:
an opening portion penetrating an interlayer insulating film on the first electrode;
the resistance changing layer covering an inner wall surface and a bottom surface of the opening portion; and
the second electrode covering the resistance changing layer inside the opening portion,
the resistance changing layer makes contact at a bottom part of the opening portion with the buffer layer which is an oxide of a metal that configures the first electrode, and
the resistance changing layer connects with the first electrode via the buffer layer.

11. The non-volatile semiconductor memory device according to claim 1, wherein
the variable resistance element includes:
an opening portion that penetrates an interlayer insulating film on a lower wiring;
the first electrode filling the opening portion;
the resistance changing layer covering an upper surface of the opening portion; and
the second electrode formed on the resistance changing layer, the buffer layer which is an oxide of a metal that configures the first electrode is formed at an upper part of the opening portion, and the resistance changing layer connects with the first electrode via the buffer layer at the upper surface of the opening portion.

* * * * *